(12) United States Patent
Wang et al.

(10) Patent No.: US 12,035,028 B2
(45) Date of Patent: Jul. 9, 2024

(54) CAMERA MODULE AND PHOTOSENSITIVE ASSEMBLY THEREOF, ELECTRONIC DEVICE, AND MANUFACTURING METHOD

(71) Applicant: NINGBO SUNNY OPOTECH CO., LTD., Zhejiang (CN)

(72) Inventors: Mingzhu Wang, Zhejiang (CN); Takehiko Tanaka, Zhejiang (CN); Zhen Huang, Zhejiang (CN); Zhenyu Chen, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 306 days.

(21) Appl. No.: 17/607,958

(22) PCT Filed: Feb. 28, 2020

(86) PCT No.: PCT/CN2020/077202
§ 371 (c)(1),
(2) Date: Nov. 1, 2021

(87) PCT Pub. No.: WO2020/220818
PCT Pub. Date: Nov. 5, 2020

(65) Prior Publication Data
US 2022/0294943 A1    Sep. 15, 2022

(30) Foreign Application Priority Data
Apr. 30, 2019   (CN) .......................... 201910360086.1

(51) Int. Cl.
*H04N 5/225* (2006.01)
*G03B 11/00* (2021.01)
(Continued)

(52) U.S. Cl.
CPC .............. *H04N 23/55* (2023.01); *G03B 11/00* (2013.01); *H04N 23/54* (2023.01); *H04N 23/57* (2023.01)

(58) Field of Classification Search
None
See application file for complete search history.

(56) References Cited

U.S. PATENT DOCUMENTS 5,797,837 A    8/1998 Minami
2001/0030276 A1   10/2001 Hoshino
(Continued)

FOREIGN PATENT DOCUMENTS

CN          1373519      10/2002
CN        101601275      12/2009
(Continued)

OTHER PUBLICATIONS

Extended European Search Report issued Apr. 25, 2022 in European Patent Application No. 20798835.3.
(Continued)

*Primary Examiner* — Twyler L Haskins
*Assistant Examiner* — Wesley J Chiu
(74) *Attorney, Agent, or Firm* — WENDEROTH, LIND & PONACK, L.L.P.

(57) ABSTRACT

Disclosed are a camera module and a photosensitive assembly thereof, an electronic device, and a manufacturing method. The photosensitive assembly includes a photosensitive chip, at least one resistance-capacitance device, an extended wiring layer, a filter element assembly, and a molded base. The filter element assembly includes a filter element and a bonding layer bonded around the filter element. The filter element assembly is attached to a top surface of the extended wiring layer, and the filter element of the filter element assembly corresponds to a light transmission (Continued)

hole of the extended wiring layer, so that external light is filtered by the filter element before reaching a photosensitive area of the photosensitive chip through the light transmission hole.

18 Claims, 10 Drawing Sheets

(51) Int. Cl.
*H04N 23/54* (2023.01)
*H04N 23/55* (2023.01)
*H04N 23/57* (2023.01)

(56) References Cited

U.S. PATENT DOCUMENTS

| | | | | |
|---|---|---|---|---|
| 2005/0285973 | A1* | 12/2005 | Singh | H04N 23/54 |
| | | | | 348/340 |
| 2010/0103296 | A1* | 4/2010 | Nakagiri | H04N 23/57 |
| | | | | 257/E31.127 |
| 2013/0128109 | A1 | 5/2013 | Ichiki et al. | |
| 2014/0110565 | A1* | 4/2014 | Teysseyre | H01L 27/14618 |
| | | | | 257/E31.127 |
| 2015/0219878 | A1* | 8/2015 | Kim | H04N 23/6812 |
| | | | | 348/360 |
| 2018/0136434 | A1* | 5/2018 | Alasirniö | G02B 7/023 |
| 2018/0211989 | A1* | 7/2018 | Hogyoku | H01L 24/18 |
| 2019/0086771 | A1 | 3/2019 | Shen et al. | |
| 2019/0141224 | A1* | 5/2019 | Park | H04N 23/54 |
| 2020/0388640 | A1* | 12/2020 | Yu | H01L 27/14618 |
| 2021/0075940 | A1* | 3/2021 | Cao | H04N 23/54 |
| 2021/0296389 | A1* | 9/2021 | Wang | H01L 27/14636 |
| 2022/0294940 | A1* | 9/2022 | Wang | H01L 27/14618 |

FOREIGN PATENT DOCUMENTS

| | | |
|---|---|---|
| CN | 102893593 | 1/2013 |
| CN | 105847645 | 8/2016 |
| CN | 205430409 | 8/2016 |
| CN | 205545597 | 8/2016 |
| CN | 107957649 | 4/2018 |
| CN | 109461746 | 3/2019 |
| CN | 208581278 | 3/2019 |
| CN | 109729241 | 5/2019 |
| CN | 109936680 | 6/2019 |
| EP | 1 237 202 | 9/2002 |
| EP | 2 309 719 | 4/2011 |
| JP | 2008-300574 | 12/2008 |
| WO | 2017/026317 | 2/2017 |

OTHER PUBLICATIONS

International Search Report dated Jun. 2, 2020, in International (PCT) Application No. PCT/CN2020/077202, with English translation.

* cited by examiner

CAMERA MODULE AND PHOTOSENSITIVE ASSEMBLY THEREOF, ELECTRONIC DEVICE, AND MANUFACTURING METHOD

FIELD OF THE INVENTION

The disclosure relates to the field of camera modules, and more particularly, to a camera module using an extended wiring process and structure to erect a circuit system of the camera module, and a photosensitive assembly thereof, an electronic device, and a manufacturing method.

BACKGROUND OF THE INVENTION

With the continuous development of machine vision, camera modules, as visual sensors, have been gradually applied into various electronic devices to provide imaging functions for various electronic devices. In a camera module, a filter is an extremely important component of the camera module. The filter mounted in a photosensitive path of the camera module can effectively filter near-infrared light and the like in imaging light so that a final imaging effect of the camera module is close to a human visual effect.

However, the filter includes, but is not limited to, blue glass, an infrared cut-off filter and the like, which are fragile and highly sensitive precision components. With regard to existing camera modules, filters are usually mounted at corresponding positions of the camera modules one by one in a pick and place manner, which is inefficient. Meanwhile, since the filter is a fragile and sensitive part, it is likely to be damaged due to an excessive stress during picking and placing. Obviously, for the packaging of the camera module, a mounting manner of the filter needs to be optimized so as to improve the efficiency and yield of filter mounting.

SUMMARY OF THE INVENTION

An object of the disclosure is to provide a camera module and a photosensitive assembly thereof, an electronic device, and a manufacturing method, wherein the camera module is packaged and configured with a circuit system of the camera module by using an extended wiring layer, so as to conduct a photosensitive chip and at least one resistance-capacitance device through the extended wiring layer.

Another object of the disclosure is to provide a camera module and a photosensitive assembly thereof, an electronic device, and a manufacturing method, wherein the extended wiring layer includes an extended wiring circuit which extends in the extended wiring layer to configure a circuit system of the camera module. That is to say, in the disclosure, no matter how the circuit system of the camera module responds to performance configuration requirements of various electronic components of the camera module, the circuit system of the camera module may be adjusted inside the extended wiring layer, and the packaging and structural dimensions of the camera module will not be affected.

Another object of the disclosure is to provide a camera module and a photosensitive assembly thereof, an electronic device, and a manufacturing method, wherein a filter element is mounted on a top side of the photosensitive assembly by means of jointed panel manufacturing and cutting to form a filter element assembly. In this way, the mounting efficiency of the filter element is improved. That is to say, in the disclosure, the filter elements are mounted at corresponding positions of the camera module in batches. In this way, the packaging efficiency of the camera module is improved.

Another object of the disclosure is to provide a camera module and a photosensitive assembly thereof, an electronic device, and a manufacturing method, wherein the filter element assembly includes a bonding layer and the filter element, and the bonding layer is integrally bonded to a periphery of the filter element, so as to improve the strength of the filter element by the bonding layer, thereby reducing the breakage rate of the filter element at the time of mounting.

Another object of the disclosure is to provide a camera module and a photosensitive assembly thereof, an electronic device, and a manufacturing method, wherein the filter element assembly is mounted on a top surface of the photosensitive assembly, and the top surface of the photosensitive assembly is defined and formed by a top surface of the extended wiring layer. The top surface of the extended wiring layer has a relatively high flatness to reduce stress exerted on the filter element assembly when it is mounted on the top surface of the photosensitive assembly, thereby further reducing the breakage rate of the filter element.

Another object of the disclosure is to provide a camera module and a photosensitive assembly thereof, an electronic device, and a manufacturing method, wherein dimensions of the filter element, including a horizontal direction dimension and a thickness direction dimension, may be reduced due to a structural strengthening effect of the bonding layer on the filter element, thereby facilitating the cost reduction of the filter element.

Another object of the disclosure is to provide a camera module and a photosensitive assembly thereof, an electronic device, and a manufacturing method, wherein when the filter element assembly is attached to the top surface of the extended wiring layer, a bonding adhesive layer therebetween may be applied to the bonding layer of the filter element assembly, so that the dimension of the filter element, particularly, the dimension in a length-width direction may be reduced, thereby facilitating the cost reduction of the filter element.

Another object of the disclosure is to provide a camera module and a photosensitive assembly thereof, an electronic device, and a manufacturing method, wherein the dimension of the filter element in the filter element assembly corresponds to that of a light transmission hole of the photosensitive assembly. By such a dimension correspondence, the amount of stray light entering the interior of the photosensitive assembly is reduced to improve the imaging quality of the camera module.

Another object of the disclosure is to provide a camera module and a photosensitive assembly thereof, an electronic device, and a manufacturing method, wherein the filter element assembly includes a set of pin through holes for allowing a set of pins of the drive element to pass and be electrically connected to the top surface of the extended wiring layer.

Another object of the disclosure is to provide a camera module and a photosensitive assembly thereof, an electronic device, and a manufacturing method, wherein the pin through holes are formed in a peripheral area of the filter element assembly, and by such a position layout, the pin through holes are naturally suitable for performing a soldering process or applying a conductive silver paste to electrically connect the drive element to the extended wiring layer.

Another object of the disclosure is to provide a camera module and a photosensitive assembly thereof, an electronic device, and a manufacturing method, wherein the filter element assembly includes a set of conducting elements, and each of the conducting elements extends between the bonding layers, and a first conducting end and a second conducting end of the conducting element are respectively exposed to a top surface and a bottom surface of the filter element assembly, which are opposite to each other, and the first conducting end electrically connects the filter element assembly to the extended wiring layer, and the second conducting end electrically connects the drive element to the filter element assembly. That is to say, the top surface of the filter element assembly simultaneously provides a mounting base surface for mounting the drive element thereon, and an electric connection surface for electrically connecting the drive element thereto. In this way, the mounting fitting accuracy of the drive element may be improved and the electric connection stability of the drive element may be enhanced.

Another object of the disclosure is to provide a camera module and a photosensitive assembly thereof, an electronic device, and a manufacturing method, wherein the top surface of the filter element assembly has a relatively high flatness to improve the mounting fitting accuracy of the drive element.

Another object of the disclosure is to provide a camera module and a photosensitive assembly thereof, an electronic device, and a manufacturing method, wherein the dimension of the bottom surface of the filter element assembly is smaller than that of the top surface of the extended wiring layer, so that a part of the bottom surface of the extended wiring layer is exposed when the filter element assembly is attached to the bottom surface of the extended wiring layer. In this way, an operation space is provided for mounting the drive element and electrically connecting the drive element to the top surface of the extended wiring layer.

Another object of the disclosure is to provide a camera module and a photosensitive assembly thereof, an electronic device, and a manufacturing method, wherein the top surface of the filter element assembly defines and forms a mounting base surface for mounting the optical lens or a lens carrying element of the camera module thereon, and the top surface of the filter element assembly has a relatively high flatness so as to improve the mounting fitting accuracy of the optical lens or the lens carrying element.

Other advantages and features of the disclosure will become apparent from the following description and may be achieved by the means and combinations particularly pointed out in the appended claims.

In accordance with the disclosure, the foregoing and other objects and advantages are achieved by a photosensitive assembly including:
- a photosensitive chip, including a photosensitive area and an electric connection area located around the photosensitive area;
- at least one resistance-capacitance device;
- an extended wiring layer, having a top surface and a bottom surface opposite to the top surface, wherein the photosensitive chip and the at least one resistance-capacitance device are electrically connected to the extended wiring layer, respectively, so that the photosensitive chip and the at least one resistance-capacitance device are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole;
- a filter element assembly, including a filter element and a bonding layer bonded around the filter element, wherein the filter element assembly is attached to the top surface of the extended wiring layer, and the filter element of the filter element assembly corresponds to the light transmission hole of the extended wiring layer, so that external light is filtered by the filter element before reaching the photosensitive area of the photosensitive chip through the light transmission hole; and
- a molded base, in which the photosensitive chip and the at least one resistance-capacitance device are received respectively and on which the extended wiring layer is supported.

In an example of the disclosure, the filter element assembly has a top surface and a bottom surface opposite to the top surface, and the bottom surface of the filter element assembly is stacked on the top surface of the extended wiring layer when the filter element assembly is attached to the top surface of the extended wiring layer, and a dimension of the bottom surface of the filter element assembly is smaller than that of the top surface of the extended wiring layer.

In an example of the disclosure, the filter element assembly has a top surface and a bottom surface opposite to the top surface, and the bottom surface of the filter element assembly is superimposed on the top surface of the extended wiring layer when the filter element assembly is attached to the top surface of the extended wiring layer, and a dimension of the bottom surface of the filter element assembly corresponds to that of the top surface of the extended wiring layer.

In an example of the disclosure, the top surface of the filter element assembly is a flat surface, and the top surface of the filter element assembly is adapted to mount an optical lens, a lens barrel, or a drive element thereon.

In an example of the disclosure, the filter element assembly further includes a set of pin through holes for allowing a set of pins of the drive element to pass and be electrically connected to the top surface of the extended wiring layer.

In an example of the disclosure, the pin through holes are penetratingly formed in a peripheral area of the filter element assembly.

In an example of the disclosure, the filter element assembly further includes a set of conducting elements, and each of the conducting elements extends between the bonding layers, and a first conducting end and a second conducting end of the conducting element are respectively exposed to the opposite top and bottom surfaces of the filter element assembly. The first conducting end exposed to the bottom surface of the filter element assembly is electrically connected to the top surface of the extended wiring layer when the filter element assembly is attached to the top surface of the extended wiring layer so that the filter element assembly is electrically connected to the top surface of the extended wiring layer. And, the second conducting end exposed to the top surface of the filter element assembly electrically connects the drive element to the filter element assembly.

In an example of the disclosure, the conducting elements are located in a peripheral area of the filter element assembly.

In an example of the disclosure, a dimension of the filter element assembly corresponds to a dimension of the opening of the light transmission hole.

In an example of the disclosure, the photosensitive assembly further includes a circuit external connection layer electrically connected to the top surface of the filter element assembly.

In an example of the disclosure, the circuit external connection layer is electrically connected to the top surface of the extended wiring layer.

In an example of the disclosure, the photosensitive assembly further includes a second extended wiring layer and a circuit external connection layer, and the second extended wiring layer is located on a bottom side of the photosensitive assembly and electrically connected to the extended wiring layer, and the circuit external connection layer is electrically connected to a bottom side of the second extended wiring layer.

In an example of the disclosure, the molded base is integrally combined with the photosensitive chip and the at least one resistance-capacitance device.

According to another aspect of the disclosure, the disclosure also provides a camera module, including:

a photosensitive assembly, including:
- a photosensitive chip, including a photosensitive area and an electric connection area located around the photosensitive area;
- at least one resistance-capacitance device;
- an extended wiring layer, having a top surface and a bottom surface opposite to the top surface, wherein the photosensitive chip and the at least one resistance-capacitance device are electrically connected to the bottom surface of the extended wiring layer, respectively, so that the photosensitive chip and the at least one resistance-capacitance device are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole;
- a filter element assembly, including a filter element and a bonding layer bonded around the filter element, wherein the filter element assembly is attached to the top surface of the extended wiring layer, and the filter element of the filter element assembly corresponds to the light transmission hole of the extended wiring layer, so that external light is filtered by the filter element before reaching the photosensitive area of the photosensitive chip through the light transmission hole; and
- a molded base, in which the photosensitive chip and the at least one resistance-capacitance device are received respectively and on which the extended wiring layer is supported; and an optical lens, mounted on a top side of the filter element assembly and held in a photosensitive path of the photosensitive assembly.

In an example of the disclosure, the filter element assembly has a top surface and a bottom surface opposite to the top surface, and the bottom surface of the filter element assembly is stacked on the top surface of the extended wiring layer when the filter element assembly is attached to the top surface of the extended wiring layer, and a dimension of the bottom surface of the filter element assembly is smaller than that of the top surface of the extended wiring layer.

In an example of the disclosure, the camera module further includes a lens barrel, and the lens barrel is mounted in an area of the top surface of the extended wiring layer that is not superimposed by the filter element assembly.

In an example of the disclosure, the camera module further includes a drive element, and the drive element is mounted in and electrically connected to an area of the top surface of the extended wiring layer that is not superimposed by the filter element assembly.

In an example of the disclosure, the filter element assembly has a top surface and a bottom surface opposite to the top surface, and the bottom surface of the filter element assembly is superimposed on the top surface of the extended wiring layer when the filter element assembly is attached to the top surface of the extended wiring layer, and a dimension of the bottom surface of the filter element assembly corresponds to that of the top surface of the extended wiring layer.

In an example of the disclosure, the camera module further includes a lens barrel, and the lens barrel is mounted on the top surface of the filter element assembly.

In an example of the disclosure, the camera module further includes a drive element, and the drive element is mounted on the top surface of the filter element assembly and electrically connected to the top surface of the extended wiring layer.

In an example of the disclosure, the filter element assembly further includes a set of pin through holes, and a set of pins of the drive element pass through the pin through holes respectively and are electrically connected to the top surface of the extended wiring layer when the drive element is attached to the top surface of the filter element assembly, and in this way, the drive element is electrically connected to the top surface of the extended wiring layer.

In an example of the disclosure, the filter element assembly includes a set of conducting element, and each of the conducting elements extends between the bonding layers, and a first conducting end and a second conducting end of the conducting element are respectively exposed to the opposite top and bottom surfaces of the filter element assembly, and the first conducting end exposed to the bottom surface of the filter element assembly is electrically connected to the top surface of the extended wiring layer when the filter element assembly is attached to the top surface of the extended wiring layer so that the filter element assembly is electrically connected to the top surface of the extended wiring layer, and a set of pins of the drive element are electrically connected to the second conducting end of the conducting element respectively when the drive element is attached to the top surface of the filter element assembly, and in this way, the drive element is electrically connected to the filter element assembly.

In an example of the disclosure, the pin through holes are penetratingly formed in a peripheral area of the filter element assembly.

According to another aspect of the disclosure, the disclosure also provides a photosensitive assembly manufacturing method, which is characterized by including the following steps:

manufacturing a filter element jointed panel including at least two filter elements and a bonding layer bonding the at least two filter elements;

manufacturing a semi-finished photosensitive assembly jointed panel including at least two semi-finished photosensitive assemblies, wherein each of the semi-finished photosensitive assemblies includes:

a photosensitive chip, including a photosensitive area and an electric connection area located around the photosensitive area;

at least one resistance-capacitance device;

an extended wiring layer, having a top surface and a bottom surface, wherein the photosensitive chip and the at least one resistance-capacitance device are electrically connected to the bottom surface of the extended wiring layer, respectively, so that the at least one resistance-capacitance device and the photosensitive chip are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole; and a molded base, integrally combined with the photosensitive chip, the at least one resistance-capacitance device, and the extended wiring layer;

attaching the filter element jointed panel to the semi-finished photosensitive assembly jointed panel to form a photosensitive assembly jointed panel, wherein each of the filter elements of the filter element jointed panel corresponds to the light transmission hole of each of the semi-finished photosensitive assembly jointed panel; and cutting the photosensitive assembly jointed panel to obtain at least two photosensitive assemblies.

In an example of the disclosure, the filter element jointed panel further includes a series of pin through holes.

In an example of the disclosure, the filter element jointed panel further includes a series of conducting elements, and each of the conducting elements extends between the bonding layers, and a first conducting end and a second conducting end of the conducting element are respectively exposed to a top surface and a bottom surface of the filter element assembly, which are opposite to each other.

Further objects and advantages of the disclosure will become more fully apparent by understanding the following description and accompanying drawings.

These and other objects, features, and advantages of the disclosure will become more fully apparent from the following detailed description, the accompanying drawings, and the appended claims.

DETAILED DESCRIPTION OF THE INVENTION

Figure 1:
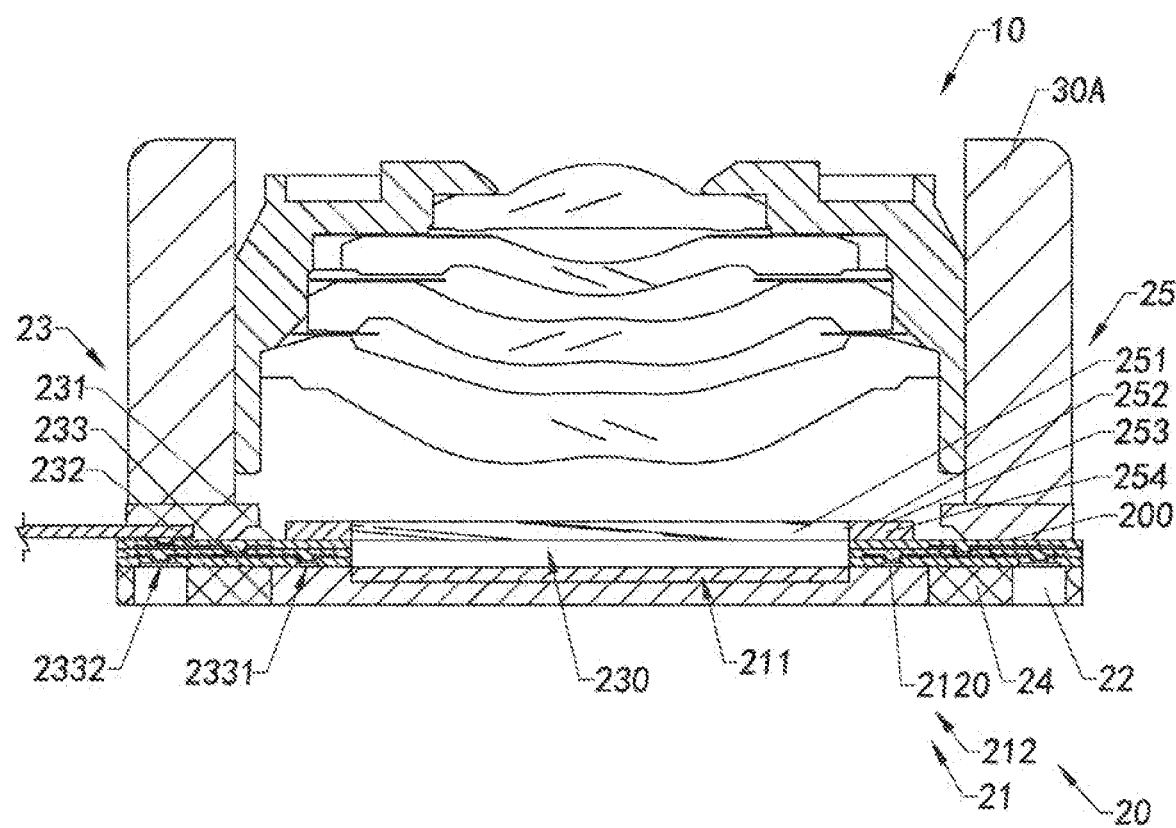
FIG. 1 is a schematic diagram of a camera module according to a preferred example of the disclosure.

The following description is used to disclose the disclosure to enable those skilled in the art to implement the disclosure. The preferred examples in the following description are by way of example only, and other obvious variations will occur to those skilled in the art. The basic principles of the disclosure as defined in the following description may be applied to other examples, modifications, improvements, equivalents, and other technical solutions without departing from the spirit and scope of the disclosure.

It should be understood by those skilled in the art that in the disclosure, the orientation or positional relationship indicated by terms "longitudinal", "transverse", "upper", "lower", "front", "back", "left", "right", "vertical", "horizontal", "top", "bottom", "inside", "outside", etc. is based on the orientation or positional relationship shown in the drawings, which is merely for the convenience of describing the disclosure and for the simplification of the description, and not to indicate or imply that the device or element referred to must have a specific orientation, or be constructed and operated in a specific orientation. Therefore, the above terms cannot be construed as limiting the disclosure.

It will be understood that the term "a/an" is construed as "at least one" or "one or more". That is, in an example, the number of an element may be one, and in another example, the number of elements may be plural. The term "a/an" cannot be construed as limiting the quantity.

Figure 2:
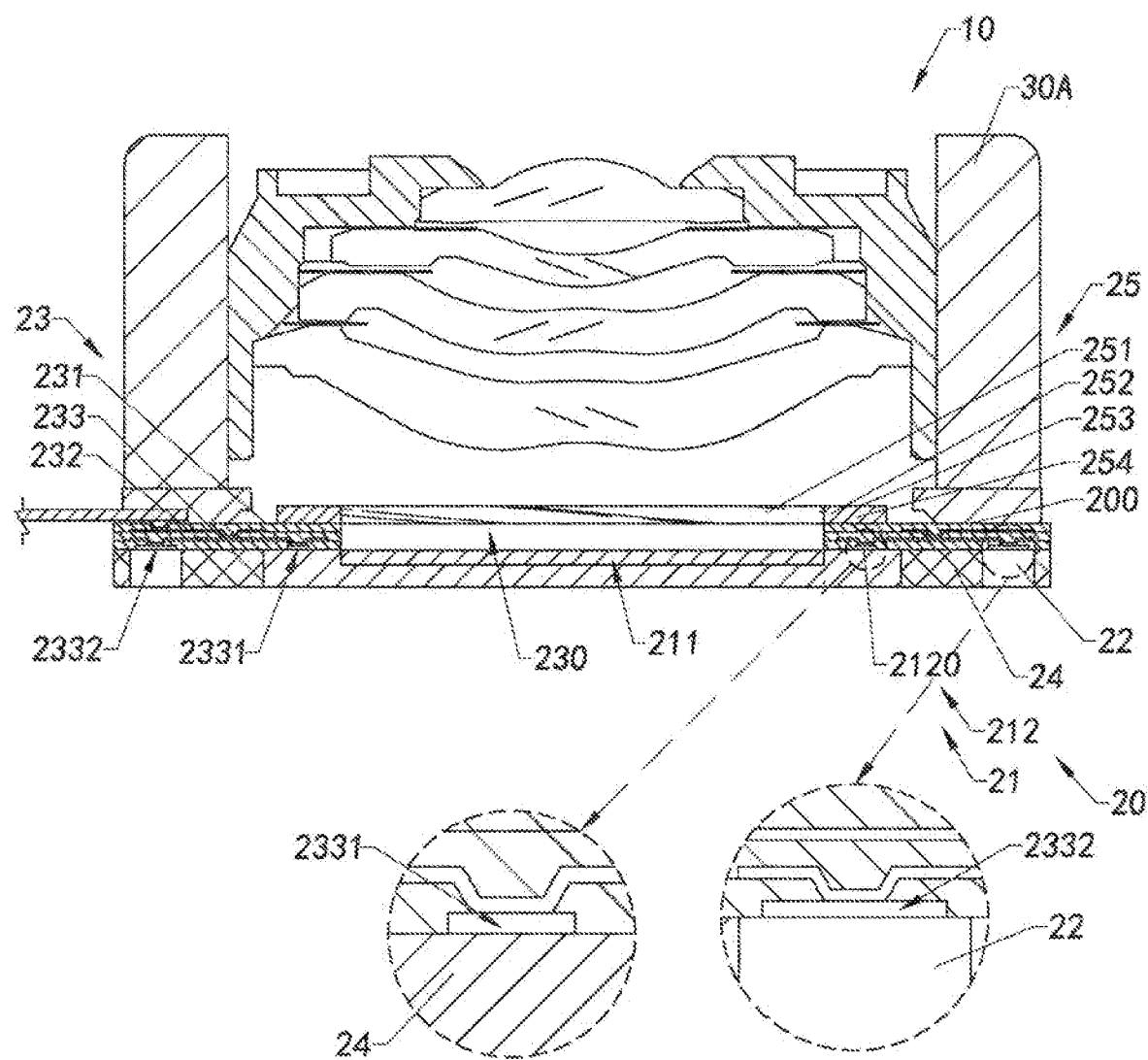
FIG. 2 is a schematic diagram of a camera module according to a preferred example of the disclosure.
Figure 3:
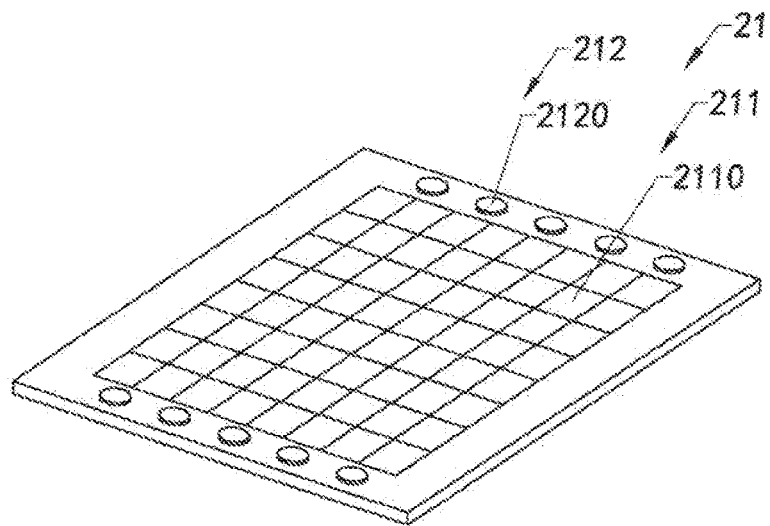
FIG. 3 is a schematic diagram of a photosensitive chip according to a preferred example of the disclosure.

As shown in FIGS. 1 to 3, a camera module according to a first preferred example of the disclosure is illustrated. The camera module may be applied to various electronic devices, such as, but not limited to, smart phones, wearable devices, computer devices, televisions, vehicles, cameras, and monitoring devices. The camera module cooperates with the electronic device to realize functions such as acquiring and reproducing a target image.

As shown in FIG. 1, in the preferred example of the disclosure, the camera module includes a photosensitive assembly 20 and an optical lens 10. The optical lens 10 is mounted on a top side of the photosensitive assembly 20 and held in a photosensitive path of the photosensitive assembly 20, so as to acquire image information about a measured object through the optical lens 10. In particular, in the preferred example of the disclosure, the camera module is a fixed-focus camera module. That is, a distance between the optical lens 10 and the photosensitive assembly 20 is not adjustable. Those skilled in the art would know that the manner in which the optical lens 10 is mounted on the photosensitive assembly 20 will vary in response to a size dimension of a mounting surface provided by the photosensitive assembly 20 for mounting the optical lens 10. More specifically, when the dimension of the mounting surface provided by the photosensitive assembly 20 for mounting the optical lens 10 is greater than that of the optical lens 10, the optical lens 10 is mounted on a top side of the photosensitive assembly 20 by means of a lens barrel 30A. When the dimension of the mounting surface provided by the photosensitive assembly 20 for mounting the optical lens 10 is smaller than that of the optical lens 10, the optical lens 10 does not need to be additionally provided with the lens barrel 30A, i.e. the optical lens 10 is mounted on the top side of the photosensitive assembly 20 in a "bare lens" manner. It is worth mentioning that in the disclosure, the type of the optical lens 10 may be adjusted according to the demands of the camera module. For example, the optical lens 10 may be implemented as an integrated optical lens, a split optical lens, a bare lens, or an optical lens including a lens barrel, etc. which is not limited by the disclosure.

Further, as shown in FIG. 1, in the preferred example of the disclosure, the photosensitive assembly 20 includes a photosensitive chip 21, at least one resistance-capacitance device 22, an extended wiring layer 23, a filter element assembly 25, and a molded base 24. The photosensitive chip 21 and the at least one resistance-capacitance device 22 are electrically connected to the extended wiring layer 23, respectively, so as to conduct the photosensitive chip 21 and the at least one resistance-capacitance device 22 through the extended wiring layer 23. The extended wiring layer 23 has a light transmission hole 230. The light transmission hole 230 corresponds to the photosensitive chip 21, so that external light can reach the photosensitive chip 21 through the light transmission hole 230 and can perform an imaging reaction at the photosensitive chip 21. The filter element assembly 25 includes a filter element 251. The filter element assembly 25 is arranged and mounted on a top side of the photosensitive assembly 20, and the filter element 251 of the filter element assembly 25 corresponds to the light transmission hole 230, so that external light is filtered by the filter element 251 before reaching the photosensitive chip 21 through the light transmission hole 230. The molded base 24 is integrally combined with the photosensitive chip 21, the at least one resistance-capacitance device 22, and the extended wiring layer 23, so that the photosensitive assembly 20 has an integrated modular structure. It should be understood that the photosensitive chip 21 and the resistance-capacitance device 22 are received in the molded base 24 respectively. The photosensitive chip 21 and the resistance-capacitance device 22 may be mounted on the molded base 24 in the above integral combination manner or after the molded base 24 is formed. For example, mounting holes are provided for the molded base 24.

It should be noted that in the preferred example of the disclosure, the photosensitive assembly 20 does not include a circuit board (e.g. PCB) and a lead wire to configure a circuit system thereof. In contrast, in the preferred example of the disclosure, a circuit system between the photosensitive chip 21 and the at least one resistance-capacitance device 22 is configured by the extended wiring layer 23. It should be appreciated that a new circuit configuration mode will result in a corresponding change of the structure and packaging mode of the camera module.

More specifically, as shown in FIGS. 2 and 3, in the preferred example of the disclosure, the photosensitive chip 21 includes a photosensitive area 211 and an electric connection area 212 located around the photosensitive area 211. The photosensitive area 211 includes a series of pixels 2110 (i.e. a photoelectric sensor) for receiving external light with imaging information about a measured object and performing a photoelectric reaction. The electric connection area 212 includes a series of electric connection ends 2120, so as to conduct the photosensitive chip 21 and other electronic components through the electric connection ends 2120 located in the electric connection area 212. Accordingly, in the preferred example of the disclosure, the extended wiring layer 23 has a top surface 231 and a bottom surface 232 opposite to the top surface 231, and includes an extended wiring circuit 233. The extended wiring circuit 233 extends between the top surface 231 and the bottom surface 232 of the extended wiring layer 23 and exposes to form a series of electric connection ends 2331, 2332 between the top surface 231 and the bottom surface 232 of the extended wiring layer 23. It should be readily understood that the photosensitive chip and electronic components may be electrically connected to the extended wiring layer 23 through the electric connection ends 2331, 2332.

In particular, the electric connection area 212 of the photosensitive chip 21 is attached to the bottom surface 232 of the extended wiring layer 23 in a face-to-face manner so that the electric connection ends 2120 located in the electric connection area 212 of the photosensitive chip 21 respectively contact and are electrically connected to the electric connection end 2331 located on the bottom surface 232 of the extended wiring layer 23. In this way, the photosensitive chip 21 is electrically connected to the bottom surface 232 of the extended wiring layer 23. Accordingly, as shown in FIG. 2, in the preferred example of the disclosure, the at least one resistance-capacitance device 22 is also stacked on the bottom surface 232 of the extended wiring layer 23 to electrically connect the at least one resistance-capacitance device 22 to the electric connection end 2332 located on the bottom surface 232 of the extended wiring layer 23, respectively. In this way, the at least one resistance-capacitance device 22 is electrically connected to the extended wiring layer 23. It should be readily understood that the photosensitive chip 21 is electrically connected to the bottom surface 232 of the extended wiring layer 23, and the at least one resistance-capacitance device 22 is electrically connected to the bottom surface 232 of the extended wiring layer 23, so that an electric connection is realized between the photosensitive chip 21 and the at least one resistance-capacitance device 22 through the extended wiring layer 23. Figuratively speaking, in the preferred example of the disclosure, the extended wiring layer 23 configures a circuit connection bridge between the photosensitive chip 21 and the at least one resistance-capacitance device 22 to conduct the photosensitive chip 21 and the at least one resistance-capacitance device 22. To facilitate understanding, in the following description, the electric connection end 2331 of the extended wiring circuit 233 for electrically connecting the photosensitive chip 21 is referred as a photosensitive chip electric connection end 2331, and the electric connection end 2332 of the extended wiring circuit 233 for electrically connecting the at least one resistance-capacitance device 22 is referred as a resistance-capacitance device electric connection end 2332.

It is worth mentioning that in the preferred example of the disclosure, the extended wiring circuit 233 is embedded in the extended wiring layer 21. Thus, on one hand, when other components of the photosensitive assembly 20 are packaged, it is unnecessary to preset an avoidance space for the extended wiring circuit 233; on the other hand, when the circuit system of the photosensitive assembly 20 or the camera module is adjusted, only the layout manner of the extended wiring circuit 233 of the extended wiring layer 23 needs to be adjusted, while an overall structural dimension of the extended wiring layer 23 may remain unchanged. That is to say, in the disclosure, no matter how the circuit system of the camera module is adjusted in response to performance configuration requirements of various electronic components of the camera module, the adjustment occurs inside the extended wiring layer 23, and the packaging and structural dimensions of the camera module will not be affected.

It is worth mentioning that in the disclosure, the extended wiring layer 23 may be formed at a corresponding position of the photosensitive assembly 20 through a rewiring technique. It should be understood by those skilled in the art that the rewiring technique is an important technology for a chip packaging process, including the following basic steps: copper sputtering, photoresist coating, exposure/development, copper grafting, separation, copper acid etching, application of dielectric coatings, etc. to extend the layout of input/output ports of a chip circuit. It should be appreciated that since the purpose of the extended wiring layer 23 in the disclosure is for packaging the photosensitive assembly 20 and configuring a circuit system of the photosensitive assembly 20, when the extended wiring layer 23 is formed by specifically using the rewiring technique, the structural features of the extended wiring layer 23 should be fully considered, and the rewiring technique should be adaptively adjusted so as to adapt to packaging demands of the camera module and the photosensitive assembly 20. For example, in the preferred example of the disclosure, the extended wiring layer 23 not only needs to electrically connect the photosensitive chip 21 and the at least one resistance-capacitance device 22, but also needs to be processed to form the light transmission hole 230, so that at least the photosensitive area 211 of the photosensitive chip 21 can be exposed out through the light transmission hole 230.

Further, those skilled in the art would know that after the circuit system of the photosensitive assembly 20 is configured, i.e. after the photosensitive chip 21 and the at least one resistance-capacitance device 22 are electrically connected, a series of pixels 2110 located in the photosensitive area 211 of the photosensitive chip 21 can receive imaging light passing through the light transmission hole 230 of the extended wiring layer 23, and an optical signal is converted into an electric signal which may be recognized and processed by a computing device by using a photoelectric reaction (commonly referred to as an imaging reaction). However, since there is light in an invisible light band such as near-infrared light in external light, this part of invisible light will affect an imaging effect of the camera module. For example, the near-infrared light in natural light may make a final imaging effect of the camera module dark-red, which is inconsistent with a normal visual effect of human eyes.

Therefore, in general, the camera module is additionally configured with a filter element 251 in the photosensitive path of the photosensitive assembly 20 for filtering external light to eliminate the influence of a part of light in the invisible light band on the imaging quality. However, those skilled in the art would know that the filter element 251 includes, but is not limited to, blue glass, an infrared cut-off filter and the like, which are fragile and highly sensitive precision components. Most of the existing filter elements are mounted at corresponding positions of the camera modules one by one in a pick and place manner. This manner is inefficient. Moreover, since the filter element is a fragile and sensitive element, it is likely to be damaged due to an excessive stress during picking and placing.

Figure 4:
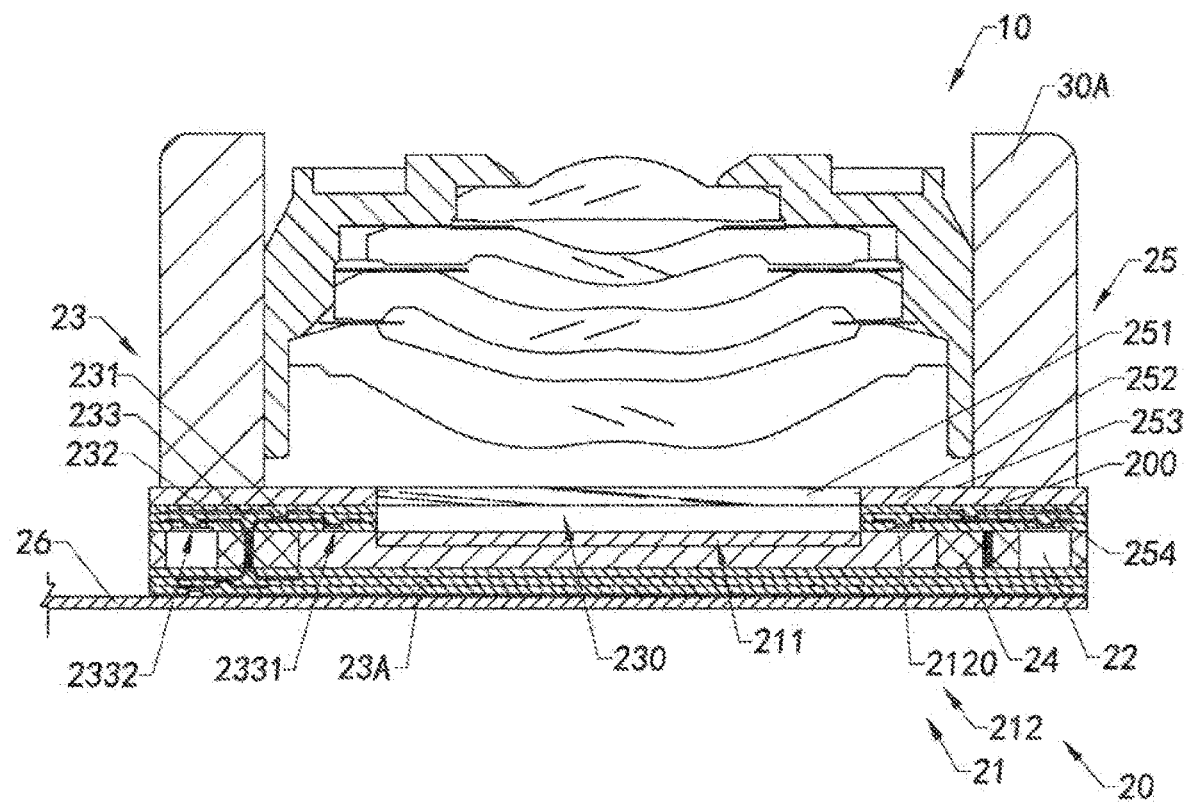
FIG. 4 is a schematic diagram of a camera module according to another preferred example of the disclosure.

Accordingly, in the preferred example of the disclosure, the filter element 251 is mounted on the top side of the photosensitive assembly 20 by means of jointed panel manufacturing and cutting to form a filter element assembly 25. More specifically, as shown in FIG. 4, in the preferred example of the disclosure, the filter element assembly 25 is mounted on a top surface 200 of the photosensitive assembly 20, and the filter element 251 of the filter element assembly 25 corresponds to the light transmission hole 230 of the photosensitive assembly 20, so that external light can be effectively filtered by the filter element 251 before reaching the photosensitive area 211 of the photosensitive chip 21 through the light transmission hole 230 to avoid adversely affecting the image quality of the camera module.

It is worth mentioning that in the preferred example of the disclosure, the top surface 200 of the photosensitive assembly 20 is defined and formed by the top surface 231 of the extended wiring layer 23. That is to say, the top surface 200 of the photosensitive assembly 20 is coplanar with the top surface 231 of the extended wiring layer 23. As previously described, in the preferred example of the disclosure, the extended wiring layer 23 is manufactured by a rewiring technique. Those skilled in the art would know that the extended wiring layer 23 formed by means of the rewiring technique has a relatively high flatness. That is to say, the top surface 231 of the extended wiring layer 23 has a relatively high flatness and the top surface 200 of the photosensitive assembly 20 has a relatively high flatness. Based on this feature, the top surface 231 of the extended wiring layer 23 (the top surface of the photosensitive assembly) is naturally suitable as a mounting base surface for the filter element 251, so as to effectively reduce stress exerted on the filter element 251 when mounted on the top surface 231 of the extended wiring layer 23, thereby reducing the mounting breakage rate of the filter element 251.

Further, in the preferred example of the disclosure, the filter element 251 is attached to the top surface 200 of the photosensitive assembly 20, i.e. the top surface 231 of the extended wiring layer 23, in the form of the filter element assembly 25. Unlike the manner of simply attaching the filter element 251 to the top surface 200 of the photosensitive assembly 20, the filter element assembly 25 includes a bonding layer 252. The bonding layer 252 is integrally bonded to a peripheral area of the filter element 251, so that the bonding layer 252 not only effectively improves the mounting conditions of the filter element 251, but also reduces the configuration requirements of the filter element 251. More specifically, first, the bonding layer 252 bonded to the peripheral area of the filter element 251 effectively improves the structural strength of the filter element 251 to reduce the amount of stress exerted on the filter element 251 when the filter element assembly 25 is mounted on the top surface 200 of the photosensitive assembly 20. That is to say, the bonding layer 252 may further reduce the mounting breakage rate of the filter element 251.

Second, since the structural strength of the filter element 251 is improved by the bonding layer 252, dimensions of the filter element 251, including a plane dimension and a thickness direction dimension, may be effectively reduced. It should be known that in the existing filter element attaching manners (the filter element is attached directly to the top surface of the photosensitive assembly), a portion of the peripheral area of the filter element is required to support the filter element held on the top surface of the photosensitive assembly. Accordingly, in the preferred example of the disclosure, the filter element 251 may be held on the top surface 200 of the photosensitive assembly 20 through the bonding layer 252. That is to say, in the preferred example of the disclosure, the required plane dimension (length-width dimension) of the filter element 251 may be reduced. Those skilled in the art would know that the cost of the filter element is directly proportional to the plane dimension, so that when the plane dimension of the filter element 251 is reduced, the cost of the filter element 251 may be reduced. That is to say, the cost occupied by the filter element 251 may be effectively reduced by attaching the filter element 251 in the manner of the filter element assembly 25, which is of economic value.

Preferably, in the preferred example of the disclosure, the plane dimension of the filter element 251 corresponds to a size of the opening of the light transmission hole 230. Thus, on one hand, imaging light entering the light transmission hole 250 may be effectively filtered by the filter element 251; on the other hand, by such a dimension correspondence, the generation of a dark corner may be prevented, and the amount of stray light entering the interior of the photosensitive assembly 20 may also be effectively reduced to indirectly improve the imaging quality of the camera module.

The bonding layer 252 has an effect of absorbing light or reducing reflection to reduce stray light around the filter element 252.

It is worth mentioning that the periphery of the filter element 251 may be provided with shading elements for reducing the generation of a part of stray light. By way of example and not limitation, a shading layer may be formed around the filter element 251 by means of silk screening.

In addition, due to the strengthening effect of the bonding layer 252, the thickness dimension of the filter element 251 may be further reduced, for example, by a grinding process, etc., so that the dimension of the filter element assembly 25 occupying the height direction of the camera module may be reduced, thereby facilitating miniaturization of the camera module.

In particular, in the preferred example of the disclosure, the filter element assembly 25 has a top surface 253 and a bottom surface 254 opposite to the top surface 253. A dimension of the bottom surface 254 of the filter element assembly 25 is smaller than that of the top surface 200 of the photosensitive assembly 20. That is, the dimension of the bottom surface 254 of the filter element assembly 25 is smaller than that of the top surface 231 of the extended wiring layer 23. Accordingly, when the filter element assembly 25 is attached to the top surface 200 of the photosensitive assembly 20, the bottom surface 254 of the filter element assembly 25 is stacked on the top surface 231 of the extended wiring layer 23. Since the dimension of the bottom surface 254 of the filter element assembly 25 is smaller than that of the top surface 231 of the extended wiring layer 23, when the bottom surface 254 of the filter element assembly 25 is stacked on the top surface 231 of the extended wiring layer 23, a part of the top surface 231 of the extended wiring layer 23 that is not covered by the filter element assembly 25 may be provided for mounting the lens barrel 30A thereon.

More specifically, as shown in FIG. 1, in the preferred example of the disclosure, a part of the top surface 231 of the extended wiring layer 23 that is not covered by the filter element assembly 25 is located in a peripheral area of the top surface 231 of the extended wiring layer 23. It should be readily appreciated that in another example of the disclosure, the lens barrel 30A may be mounted on the top surface 253 of the filter element assembly 25. More specifically, as shown in FIG. 4, in the present example, the dimension of the bottom surface 254 of the filter element assembly 25 corresponds to that of the top surface 231 of the extended wiring layer 23, so that when the filter element assembly 25 is attached to the top surface 231 of the extended wiring layer 23, the bottom surface 254 of the filter element assembly 25 is completely superimposed on the top surface 231 of the extended wiring layer 23. Accordingly, at this moment, the top surface 253 of the filter element assembly 25 provides a mounting base surface for mounting the lens barrel 30A. It is worth mentioning that in the disclosure, the filter element assembly 25 may be manufactured by a molding process. The top surface 253 of the filter element assembly 25 may have a relatively high flatness by adjusting the flatness of a molding surface of a molding die, so as to improve the mounting fitting accuracy of the lens barrel 30A to indirectly ensure the fitting accuracy between the optical lens 10 and the photosensitive chip 21.

Further, as shown in FIG. 1, in the preferred example of the disclosure, the photosensitive assembly 20 further includes a circuit external connection layer 26. The circuit external connection layer 26 is electrically connected to the photosensitive assembly 20 for conducting the camera module to other electronic devices. In particular, in the disclosure, the circuit external connection layer 26 may be configured to be electrically connected to the top surface 200 of the photosensitive assembly 20, i.e. the top surface 231 of the extended wiring layer 23. Of course, the circuit external connection layer 26 is preferably arranged on a bottom side of the photosensitive assembly 20 in order to realize this technical solution. The extended wiring layer 23 further includes a second extended wiring layer 23A. The second extended wiring layer 23A is located on the bottom side of the photosensitive assembly 20 and electrically connected to the extended wiring layer 23 located on the top side of the photosensitive assembly 20. Accordingly, by electrically connecting only the circuit external connection layer 26 to a bottom side of the second extended wiring layer 23A, the circuit external connection layer 26 can be arranged on the bottom side of the photosensitive assembly 20.

It is worth mentioning that the circuit external connection layer 26 may be a rigid circuit board or a flexible circuit board. For example, the circuit external connection layer 26 may be a flexible circuit board which is electrically connected to the top surface 231 of the extended wiring layer 23 or the bottom side of the second extended wiring layer 23A by means of soldering or conductive adhesive connection.

Figure 5:
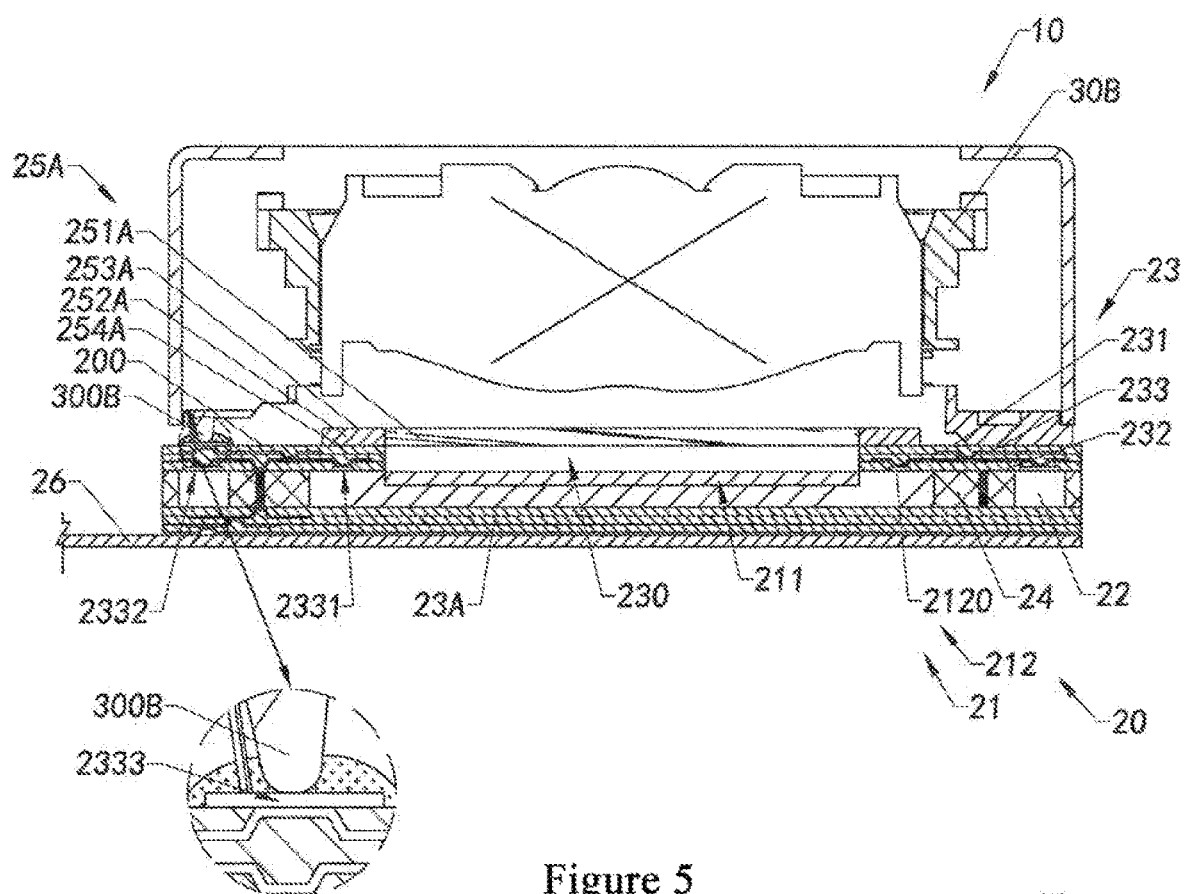
FIG. 5 is a schematic diagram of a camera module according to another preferred example of the disclosure.

As shown in FIG. 5, a camera module according to a second preferred example of the disclosure is illustrated. In the preferred example of the disclosure, the camera module may be implemented as a dynamic focus camera module. That is, a distance between the optical lens 10 and the photosensitive assembly 20 is adjustable. More specifically, as shown in FIG. 5, in the preferred example of the disclosure, the camera module further includes a drive element 30B. The drive element 30B is mounted on the top side of the photosensitive assembly 20 and corresponds to the photosensitive path of the photosensitive assembly 20. The optical lens 10 is coaxially mounted on the drive element 30B. The drive element 30B carries the optical lens 10 to be close to or away from the photosensitive assembly 20 when the drive element 30B is driven. It is worth mentioning that the drive element 30B includes, but is not limited to, a voice coil motor, a stepping motor, a MEMS, etc.

As previously described, in the disclosure, the camera module does not include a circuit board (e.g. PCB) and leads and a lead wire to configure a circuit system thereof. In contrast, the extended wiring layer 23 is used to configure the circuit system of the camera module to electrically connect various electronic devices of the camera module.

More specifically, in the preferred example of the disclosure, the extended wiring layer 23 has a top surface 231 and a bottom surface 232 opposite to the top surface 231, and includes an extended wiring circuit 233. The extended wiring circuit 233 extends between the top surface 231 and the bottom surface 232 of the extended wiring layer 23 and exposes a series of electric connection ends 2331, 2332, 2333 of the extended wiring circuit 233 between the top surface 231 and the bottom surface 232 of the extended wiring layer 23. It should be readily understood that the photosensitive chip 21 and electronic components may be electrically connected to the extended wiring layer 23 through the electric connection ends 2331, 2332, 2333.

In particular, as shown in FIG. 5, in the preferred example of the disclosure, the electric connection area 212 of the photosensitive chip 21 is attached to the bottom surface 232 of the extended wiring layer 23 in a face-to-face manner so that the electric connection ends 2120 located in the electric connection area 212 of the photosensitive chip 21 respectively contact and are electrically connected to the electric connection end 2331 located on the bottom surface 232 of the extended wiring layer 23. In this way, the photosensitive chip 21 is electrically connected to the bottom surface 232 of the extended wiring layer 23. Accordingly, as shown in FIG. 5, in the preferred example of the disclosure, the at least one resistance-capacitance device 22 is also stacked on the bottom surface 232 of the extended wiring layer 23 to electrically connect the at least one resistance-capacitance device 22 to the electric connection end 2332 located on the bottom surface 232 of the extended wiring layer 23, respectively. It should be readily understood that the photosensitive chip 21 is electrically connected to the bottom surface 232 of the extended wiring layer 23, and the at least one resistance-capacitance device 22 is electrically connected to the bottom surface 232 of the extended wiring layer 23, so that an electric connection is realized between the photosensitive chip 21 and the at least one resistance-capacitance device 22 through the extended wiring layer 23. Further, as shown in FIG. 5, unlike the first preferred example, in the preferred example of the disclosure, a part of the electric connection end 2333 of the extended wiring circuit 233 is exposed to the top surface 231 of the extended wiring layer 23, so that the drive element 30B can be electrically connected to the extended wiring layer 23 through the electric connection end 2333 exposed to the top surface 231 of the extended wiring layer 23 when the drive element 30B is mounted on the top side of the photosensitive assembly 20. Thus, it should be understood that in the preferred example of the disclosure, the circuit system of the camera module is configured through the extended wiring layer, so as to electrically connect the photosensitive chip 21, the at least one resistance-capacitance device 22, and the drive element 30B.

To facilitate understanding, in the following description, the electric connection end 2331 of the extended wiring circuit 233 for electrically connecting the photosensitive chip 21 is referred as a photosensitive chip electric connection end 2331, and the electric connection end 2332 of the extended wiring circuit 233 for electrically connecting the at least one resistance-capacitance device 22 is referred as a resistance-capacitance device electric connection end 2332, and the electric connection end 2333 of the extended wiring circuit 233 for electrically connecting the drive element 30B is referred as a drive element electric connection end 2333.

It is worth mentioning that in the preferred example of the disclosure, the extended wiring circuit 233 is embedded in the extended wiring layer 21. Thus, on one hand, when other components of the photosensitive assembly 20 are packaged, it is unnecessary to preset an avoidance space for the extended wiring circuit 233; on the other hand, when the circuit system of the photosensitive assembly 20 or the camera module is adjusted, only the layout manner of the extended wiring circuit 233 of the extended wiring layer 23 needs to be adjusted, while an overall structural dimension of the extended wiring layer 23 may remain unchanged. That is to say, in the disclosure, no matter how the circuit system of the camera module is adjusted in response to performance configuration requirements of various electronic components of the camera module, the adjustment occurs inside the extended wiring layer 23, and the packaging and structural dimensions of the camera module will not be affected.

It is worth mentioning that in the disclosure, the extended wiring layer 23 may be formed at a corresponding position of the photosensitive assembly 20 by a rewiring technique. It should be understood by those skilled in the art that the rewiring technique is an important technology for a chip packaging process, including the following basic steps: copper sputtering, photoresist coating, exposure/development, copper grafting, separation, copper acid etching, application of dielectric coatings, etc. to extend the layout of input/output ports of a chip circuit. It should be appreciated that since the purpose of the extended wiring layer 23 in the disclosure is to be used for packaging the photosensitive assembly 20 and configuring a circuit system of the photosensitive assembly 20, when the extended wiring layer 23 is formed by specifically using the rewiring technique, the structural features of the extended wiring layer 23 should be fully considered, and the rewiring technique should be adaptively adjusted so as to adapt to packaging demands of the camera module and the photosensitive assembly 20. For example, in the preferred example of the disclosure, the extended wiring layer 23 not only needs to electrically connect the photosensitive chip 21 and the at least one resistance-capacitance device 22, but also needs to be processed to form the light transmission hole 230, so that at least the photosensitive area 211 of the photosensitive chip 21 can be exposed through the light transmission hole 230.

Further, those skilled in the art would know that after the circuit system of the photosensitive assembly 20 is configured, i.e. after the photosensitive chip 21 and the at least one resistance-capacitance device 22 are electrically connected, a series of pixels 2110 located in the photosensitive area 211 of the photosensitive chip 21 can receive imaging light passing through the light transmission hole 230 of the extended wiring layer 23, and an optical signal is converted into an electric signal which may be recognized and processed by a computing device by using a photoelectric reaction (commonly referred to as an imaging reaction). However, since there is light in an invisible light band such as near-infrared light in external light, this part of invisible light will affect an imaging effect of the camera module. For example, the near-infrared light in natural light may make a final imaging effect of the camera module dark-red, which is inconsistent with a normal visual effect of human eyes.

Therefore, in general, the camera module is additionally configured with a filter element 251A in the photosensitive path of the photosensitive assembly 20 for filtering external light to eliminate the influence of a part of light in an invisible light band on the imaging quality. However, those skilled in the art would know that the filter element 251A includes, but is not limited to, blue glass, an infrared cut-off filter and the like, which are fragile and highly sensitive precision components. Most of the existing filter elements are mounted at corresponding positions of the camera modules one by one in a pick and place manner. This manner is inefficient. Moreover, since the filter element is a fragile and sensitive element, it is likely to be damaged due to an excessive stress during picking and placing.

Accordingly, in the preferred example of the disclosure, the filter element 251A is mounted on the top side of the photosensitive assembly 20 by means of jointed panel manufacturing and cutting to form a filter element assembly 25A. More specifically, as shown in FIG. 5, in the preferred example of the disclosure, the filter element assembly 25A is mounted on a top surface 200 of the photosensitive assembly 20, and the filter element 251A of the filter element assembly 25A corresponds to the light transmission hole 230 of the photosensitive assembly 20, so that external light can be effectively filtered by the filter element 251A before reaching the photosensitive area 211 of the photosensitive chip 21 through the light transmission hole 230 to avoid adversely affecting the image quality of the camera module.

It is worth mentioning that in the preferred example of the disclosure, the top surface 200 of the photosensitive assembly 20 is defined and formed by the top surface 231 of the extended wiring layer 23. That is to say, the top surface 200 of the photosensitive assembly 20 is coplanar with the top surface 231 of the extended wiring layer 23. As previously described, in the preferred example of the disclosure, the extended wiring layer 23 is manufactured by a rewiring technique. Those skilled in the art would know that the extended wiring layer 23 formed by means of the rewiring technique has a relatively high flatness. That is to say, the top surface 231 of the extended wiring layer 23 has a relatively high flatness and the top surface 200 of the photosensitive assembly 20 has a relatively high flatness. Based on this feature, the top surface 231 of the extended wiring layer 23 (the top surface of the photosensitive assembly) is naturally suitable as a mounting base surface for the filter element 251A, so as to effectively reduce stress exerted on the filter element 251A when it is mounted on the top surface 231 of the extended wiring layer 23, thereby reducing the mounting breakage rate of the filter element 251A. Meanwhile, since the drive element electric connection end 233 of the extended wiring circuit 233 of the extended wiring layer 23 is located on the top surface 231 of the extended wiring layer 23, the top surface 231 of the extended wiring layer 23 further forms an electric connection surface for electrically connecting the drive element 30B.

Further, in the preferred example of the disclosure, the filter element 251A is attached to the top surface 200 of the photosensitive assembly 20, i.e. the top surface 231 of the extended wiring layer 23, in the form of the filter element assembly 25A. Unlike the manner of simply attaching the filter element 251A to the top surface 200 of the photosensitive assembly 20, the filter element assembly 25A includes a bonding layer 252A. The bonding layer 252A is integrally bonded to a peripheral area of the filter element 251A, so that the bonding layer 252A not only effectively improves the mounting conditions of the filter element 251A, but also reduces the configuration requirements of the filter element 251A. More specifically, first, the bonding layer 252A bonded to the peripheral area of the filter element 251A effectively improves the structural strength of the filter element 251A to reduce the amount of stress exerted on the filter element 251A when the filter element assembly 25A is mounted on the top surface 200 of the photosensitive assembly 20. That is to say, the bonding layer 252A may further reduce the mounting breakage rate of the filter element 251A.

Second, since the structural strength of the filter element 251A is improved by the bonding layer 252A, dimensions of the filter element 251A, including a plane dimension and a thickness direction dimension, may be effectively reduced. It should be known that in the existing filter element attaching manners (the filter element is attached directly to the top surface of the photosensitive assembly), a part of the peripheral area of the filter element is required to support the filter element held on the top surface of the photosensitive assembly. Accordingly, in the preferred example of the disclosure, the filter element 251A may be held on the top surface 200 of the photosensitive assembly 20 through the bonding layer 252A. That is to say, in the preferred example of the disclosure, the required plane dimension (length-width dimension) of the filter element 251A may be reduced. Those skilled in the art would know that the cost of the filter element is directly proportional to the plane dimension, so that when the plane dimension of the filter element 251A is reduced, the cost of the filter element 251A may be reduced. That is to say, the cost occupied by the filter element 251A may be effectively reduced by attaching the filter element 251A in the manner of the filter element assembly 25A, which is of economic value.

Preferably, in the preferred example of the disclosure, the plane dimension of the filter element 251A corresponds to a size of the opening of the light transmission hole 23. Thus, on one hand, imaging light entering the light transmission hole 23 may be effectively filtered by the filter element 251A; on the other hand, by such a dimension correspondence, the generation of a dark corner may be prevented, and the amount of stray light entering the interior of the photosensitive assembly 20 may also be effectively reduced to indirectly improve the imaging quality of the camera module.

The bonding layer 252 has an effect of absorbing light or reducing reflection to reduce stray light around the filter element 252.

It is worth mentioning that the periphery of the filter element 251 may be provided with shading elements for reducing the generation of a part of the stray light. By way of example and not limitation, a shading layer may be formed around the filter element 251 by means of silk screening.

In addition, due to the strengthening effect of the bonding layer 252A, the thickness dimension of the filter element 251A may be further reduced, for example, by a grinding process, etc., so that the dimension of the filter element assembly 25A occupying the height direction of the camera module may be reduced, thereby facilitating miniaturization of the camera module.

It is worth mentioning that in the preferred example of the disclosure, after the filter element assembly 25A is mounted, the drive element 30B needs to be mounted on the top side of the filter element assembly 25A and electrically connected to the top surface 231 of the extended wiring layer 23. That is to say, during design and mounting of the filter element assembly 25A, it is ensured that the drive element 30B can be electrically connected to the top surface 231 of the extended wiring layer 23.

As shown in FIG. 5, in a specific example of the disclosure, the filter element assembly 25A has a top surface 253A and a bottom surface 254A opposite to the top surface 253A. A dimension of the bottom surface 254A of the filter element assembly 25A is smaller than that of the top surface 200 of the photosensitive assembly 20. That is, the dimension of the bottom surface 254A of the filter element assembly 25A is smaller than that of the top surface 231 of the extended wiring layer 23. Accordingly, when the filter element assembly 25A is attached to the top surface 231 of the extended wiring layer 23, a portion of the top surface 231 of the extended wiring layer 23 is not covered by the filter element assembly 25A since the dimension of the bottom surface 254A of the filter element assembly 25A is smaller than that of the top surface 231 of the extended wiring layer 23. That is to say, the drive element 30B may be electrically connected to the top surface 31 of the extended wiring layer 23 while the drive element 30B is mounted on the top side of the filter element assembly 25A by only arranging the drive element electric connection end 2333 of the extended wiring circuit 233 on the part of the top surface 231 of the extended wiring layer 23 that is not covered by the filter element assembly 25A.

More specifically, as shown in FIG. 5, in the specific example of the disclosure, when the drive element 30B is mounted on the top side of the filter element assembly 25A, the drive element 30B is supported on the top surface 253A of the filter element assembly 25A. A set of pins 300B of the drive element 30B are respectively aligned and electrically connected to the drive element electric connection end 2333 located on the part of the top surface 231 of the extended wiring layer 23 that is not covered by the filter element assembly 25A. In this way, the drive element 30B is electrically connected to the top surface 231 of the extended wiring layer 23. More specifically, in the specific example of the disclosure, a part of the top surface 231 of the extended wiring layer 23 that is not covered by the filter element assembly 25A is located in a peripheral area of the top surface 231 of the extended wiring layer 23.

It is worth mentioning that those skilled in the art would know that the pins 300B of the drive element 30B may be firmly and electrically connected to the drive element electric connection end 233 by means of soldering or applying a conductive silver paste at a connecting position of the pins 300B of the drive element 30B and the drive element electric connection end 2333, so as to enhance the stability of the electric connection between the drive element 30B and the extended wiring layer 23.

Figure 6:
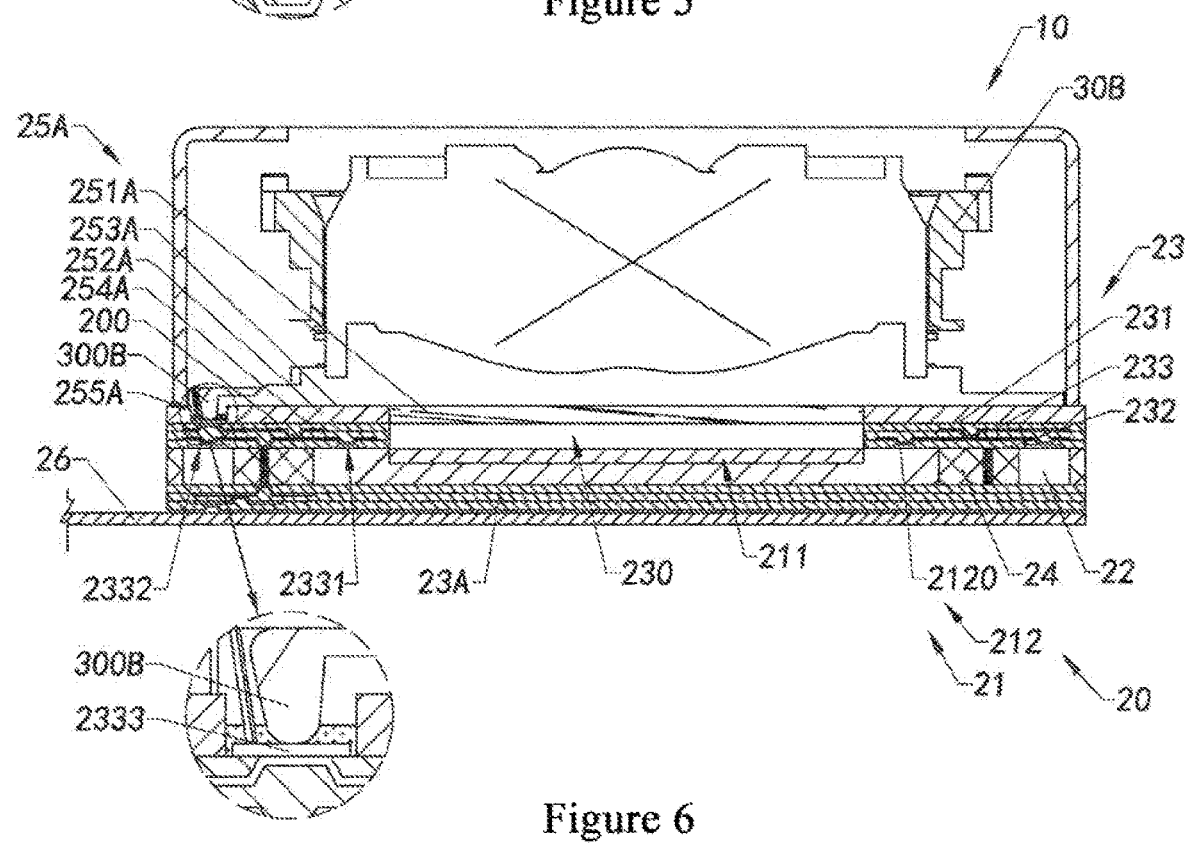
FIG. 6 is a schematic diagram of a camera module according to another preferred example of the disclosure.

FIG. 6 shows a modified example of the second preferred example provided by the disclosure. In the modified example, the dimension of the bottom surface 254A of the filter element assembly 25A corresponds to that of the top surface 231 of the extended wiring layer 23, so that when the filter element assembly 25A is attached to the top surface 200 of the photosensitive assembly 20, the bottom surface 254A of the filter element assembly 25A is completely superimposed on the top surface 200 of the photosensitive assembly 20. Accordingly, at this moment, the top surface 253A of the filter element assembly 25A provides a mounting base surface for mounting the drive element 30B, whereas the drive element electric connection end 2333 located on the top surface 231 of the extended wiring layer 23 is covered by the bottom surface 254A of the filter element assembly 25A.

Accordingly, in order to establish an electric connection between the drive element 30B and the extended wiring layer 23, the filter element assembly 25A further includes a set of pin through holes 255A for allowing the set of pins 300B of the drive element 30B to pass and be electrically connected to the top surface 231 of the extended wiring layer 23. More specifically, the pins 300B of the drive element 30B pass through the pin through holes 255A respectively and are electrically connected to the top surface 231 of the extended wiring layer 23 when the drive element 30B is attached to the top surface 253A of the filter element assembly 25A. In this way, the drive element 30B is electrically connected to the top surface 231 of the extended wiring layer 23.

It is worth mentioning that in the preferred example of the disclosure, the pin through holes 255A are formed in a peripheral area of the filter element assembly 25A. By such a position layout, the pin through holes 255A are naturally suitable for performing a soldering process or applying a conductive silver paste to electrically connect the drive element 30B to the extended wiring layer 23.

Figure 7A:
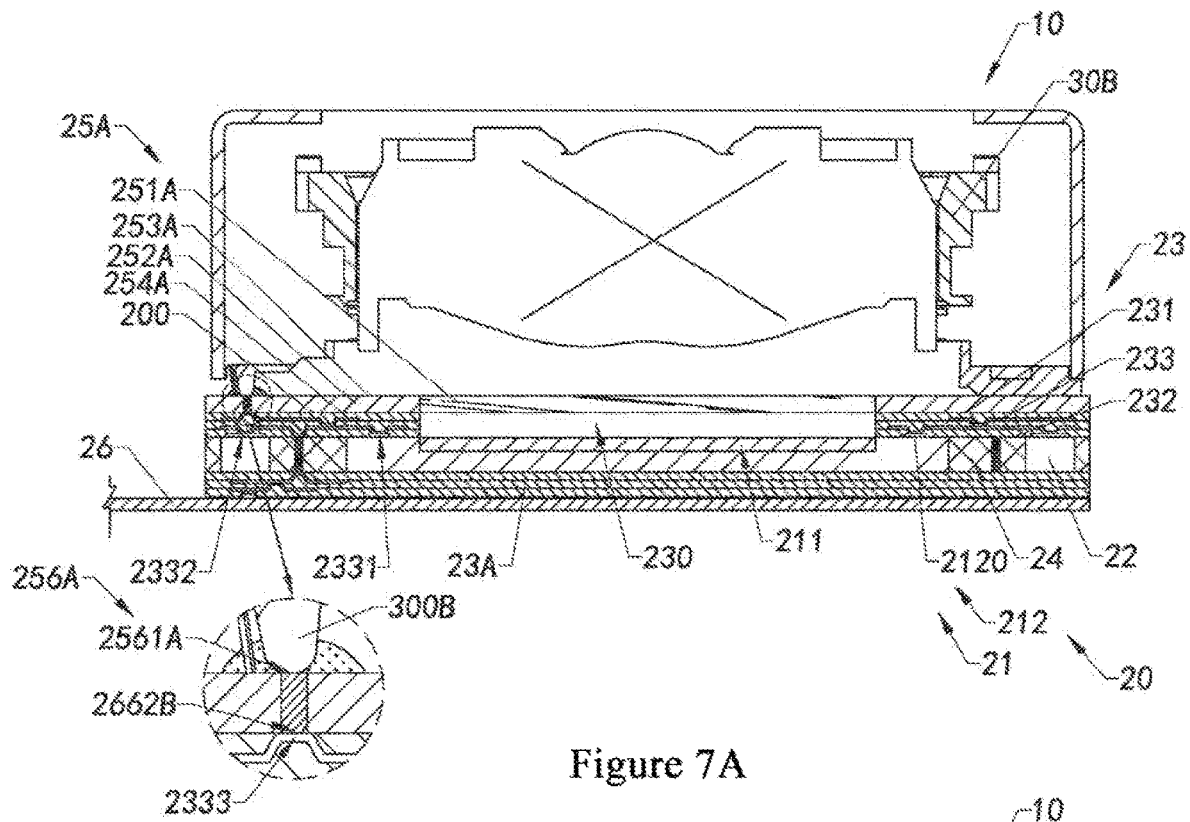
FIG. 7A is a schematic diagram of a camera module according to another preferred example of the disclosure.

FIG. 7A shows another modified example of the second preferred example provided by the disclosure. In this modified example, the dimension of the bottom surface 254A of the filter element assembly 25A corresponds to that of the top surface 231 of the extended wiring layer 23, so that when the filter element assembly 25A is attached to the top surface 200 of the photosensitive assembly 20, the bottom surface 254A of the filter element assembly 25A is completely superimposed on the top surface 253A of the photosensitive assembly 20. Accordingly, at this moment, the top surface 253A of the filter element assembly 25A provides a mounting base surface for mounting the drive element 30B, whereas the drive element electric connection end 233 located on the top surface 231 of the extended wiring layer 23 is covered by the bottom surface 254A of the filter element assembly 25A.

Accordingly, in order to establish an electric connection between the drive element 30B and the extended wiring layer 23, the filter element assembly 25A further includes a set of conducting elements 256A. Each of the conducting elements 256A extends between the bonding layers 252A, and a first conducting end 2561A and a second conducting end 2562A of the conducting element 256A are respectively exposed to the top surface 253A and the bottom surface 254A of the filter element assembly 25A. When the filter element assembly 25A is attached to the top surface 231 of the extended wiring layer 23, the first conducting end 2561A is electrically connected to the top surface 231 of the extended wiring layer 23 so that the filter element assembly 25A is electrically connected to the top surface 231 of the extended wiring layer 23. Meanwhile, the second conducting end 2562A is exposed to the top surface 253A of the filter element assembly 25A, so that when the drive element 30B is mounted on the top surface 253A of the filter element assembly 25A, the pins 300B of the drive element 30B may be aligned and electrically connected to the second conducting end 2562A, respectively. In this way, the drive element 30B is electrically connected to the filter element assembly 25A. It should be readily appreciated that the drive element 30B is electrically connected to the filter element assembly 25A, and the drive element 30B is electrically connected to the top surface 231 of the extended wiring layer 23, thereby indirectly electrically connecting the drive element 30B to the extended wiring layer 23 through the conducting element 256A of the filter element assembly 25A.

Figure 7B:
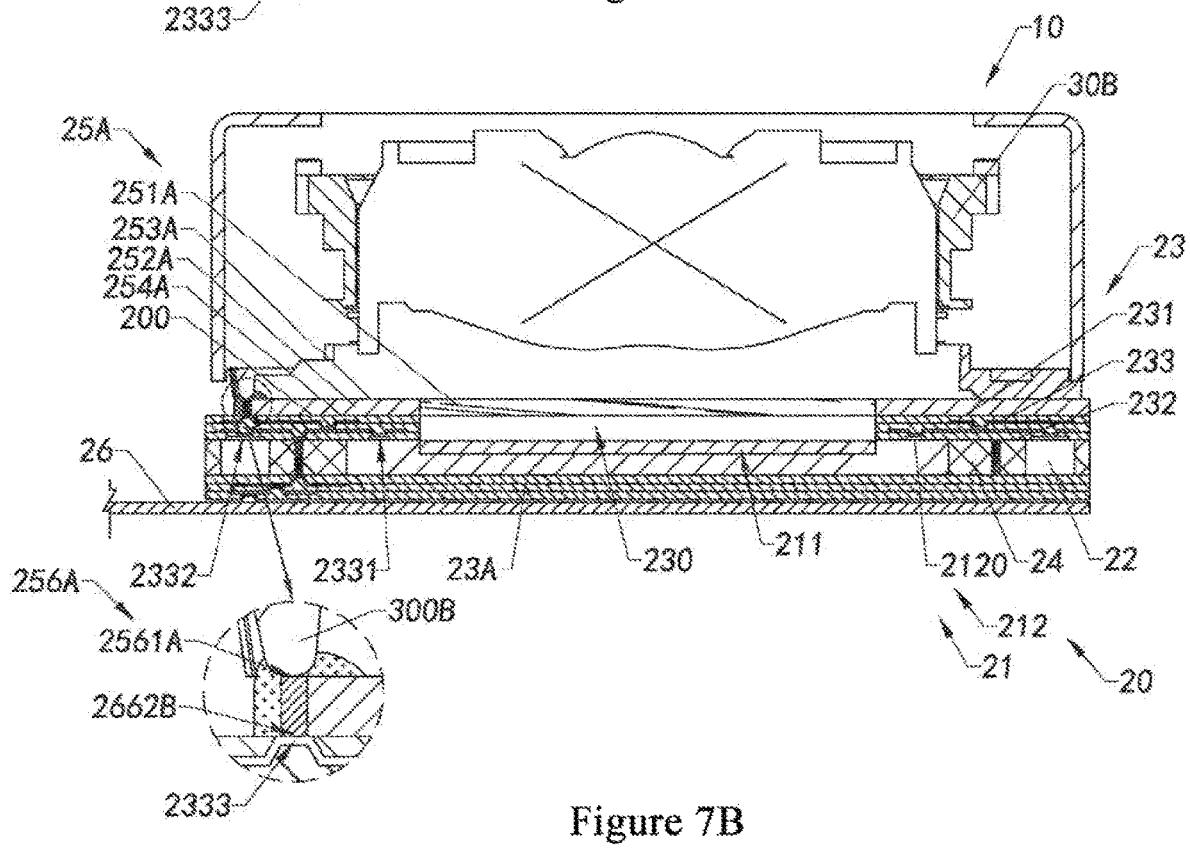
FIG. 7B is a schematic diagram of a camera module according to another preferred example of the disclosure.

It is worth mentioning that in the modified example of the disclosure, with reference to FIG. 7B, the conducting elements 256A are arranged in a peripheral area of the filter element assembly 25A. By such a position layout, the conducting elements 256A are naturally suitable for performing a soldering process or applying a conductive silver paste to electrically connect the drive element 30B to the filter element assembly 25A.

It is also mentioning that in the disclosure, the filter element assembly 25A may be manufactured by a molding process. The top surface 253a of the filter element assembly 25A may have a relatively high flatness by adjusting the flatness of a molding surface of a molding die, so as to improve the mounting fitting accuracy of the drive element 30B to indirectly ensure the fitting accuracy between the optical lens 10 and the photosensitive chip 21.

Further, as shown in FIG. 7B, in the preferred example of the disclosure, the photosensitive assembly 20 further includes a circuit external connection layer 26. The circuit external connection layer 26 is electrically connected to the photosensitive assembly 20 for conducting the camera module to other electronic devices. In particular, in the disclosure, the circuit external connection layer 26 may be configured to be electrically connected to the top surface 200 of the photosensitive assembly 20, i.e. the top surface 231 of the extended wiring layer 23. Or, the circuit external connection layer 26 is electrically connected to the top surface 253A of the filter element assembly 25A. Of course, the circuit external connection layer 26 is preferably arranged on a bottom side of the photosensitive assembly 20 in order to realize this technical solution. The extended wiring layer 23 further includes a second extended wiring layer 23A. The second extended wiring layer 23A is located on the bottom side of the photosensitive assembly 20 and electrically connected to the extended wiring layer 23 located on the top side of the photosensitive assembly 20. Accordingly, by electrically connecting only the circuit external connection layer 26 to a bottom side of the second extended wiring layer 23A, the circuit external connection layer 26 can be arranged on the bottom side of the photosensitive assembly 20.

It is worth mentioning that the circuit external connection layer 26 may be a rigid circuit board or a flexible circuit board. For example, the circuit external connection layer 26 may be a flexible circuit board which is electrically connected to the top surface 231 of the extended wiring layer 23 or the bottom side of the second extended wiring layer 23A by means of soldering or conductive adhesive connection.

Figure 8:
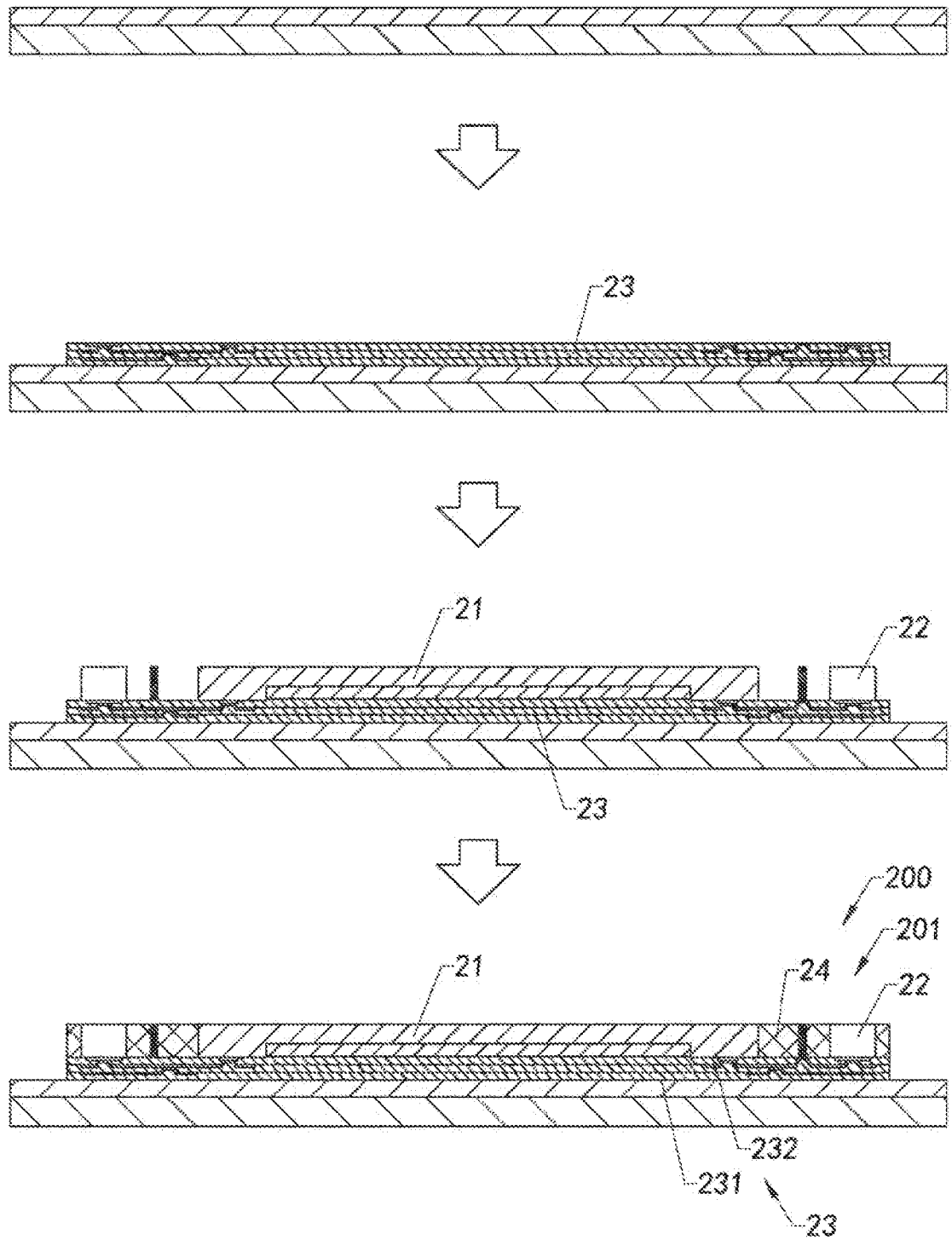
FIG. 8 is a schematic diagram of a manufacturing process of a photosensitive assembly according to a preferred example of the disclosure.
Figure 9:
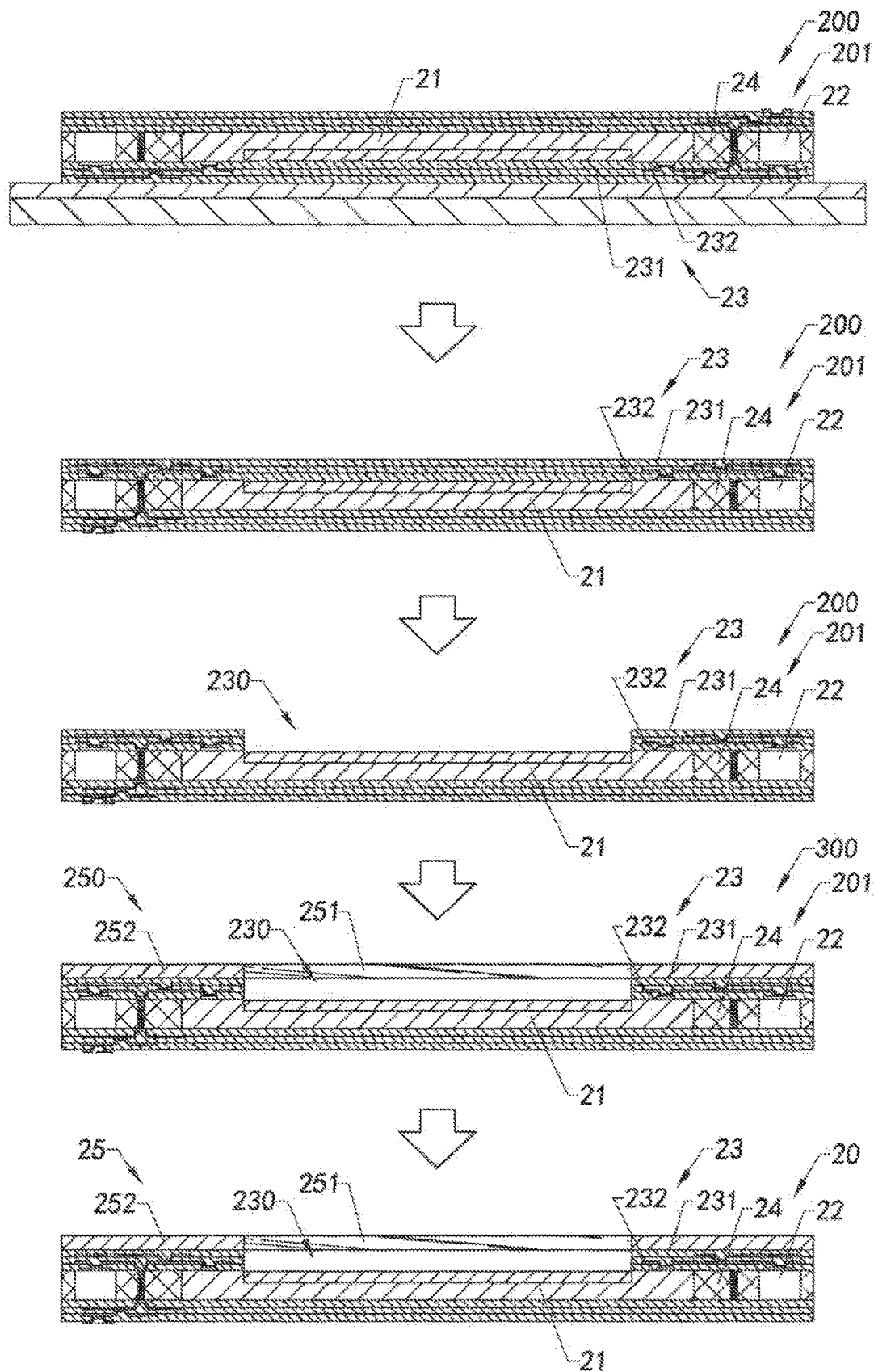
FIG. 9 is a schematic diagram of the manufacturing process of the photosensitive assembly according to the above preferred example of the disclosure.

According to another aspect of the disclosure, the disclosure also provides a manufacturing method of the photosensitive assembly 20. With reference to FIG. 8 to FIG. 9, the method includes the following steps.

S1. A filter element jointed panel 250 is manufactured. The filter element jointed panel 250 includes at least two filter elements 251, 251A, and a bonding layer 252, 252A (only one filter element 251 and one bonding layer 252A are shown in the figure) bonding the at least two filter elements 251, 251A.

S2. A semi-finished photosensitive assembly jointed panel 200 is manufactured. The semi-finished photosensitive assembly jointed panel 200 includes at least two semi-finished photosensitive assemblies 201. Each of the semi-finished photosensitive assemblies 201 includes:

a photosensitive chip 21, the photosensitive chip 21 including a photosensitive area 211 and an electric connection area 212 located around the photosensitive area 211;

at least one resistance-capacitance device 22;

an extended wiring layer 23, the extended wiring layer 23 having a top surface 231 and a bottom surface 232, wherein the photosensitive chip 21 and the at least one resistance-capacitance device 22 are electrically connected to the bottom surface 232 of the extended wiring layer 23, respectively, so that the at least one resistance-capacitance device 22 and the photosensitive chip 21 are conducted through the extended wiring layer 23, and the top surface 231 of the extended wiring layer 23 defines and forms a top surface of the semi-finished photosensitive assembly 201, and the extended wiring layer 23 has a light transmission hole 230, and the light transmission hole 230 corresponds to at least the photosensitive area 211 of the photosensitive chip 21, so as to allow external light to reach at least the photosensitive area 211 of the photosensitive chip 21 through the light transmission hole 230; and a molded base 24, the molded base 25 being integrally combined with the photosensitive chip 21, the at least one resistance-capacitance device 22, and the extended wiring layer 23.

S3. The filter element jointed panel 250 is attached to the semi-finished photosensitive assembly jointed panel 200 to form a photosensitive assembly jointed panel 300. Each of the filter elements 251, 251A of the filter element jointed panel 250 corresponds to the light transmission hole 230 of each of the semi-finished photosensitive assemblies 201.

S4. The photosensitive assembly jointed panel 300 is cut to obtain at least two photosensitive assemblies 20.

Figure 10:
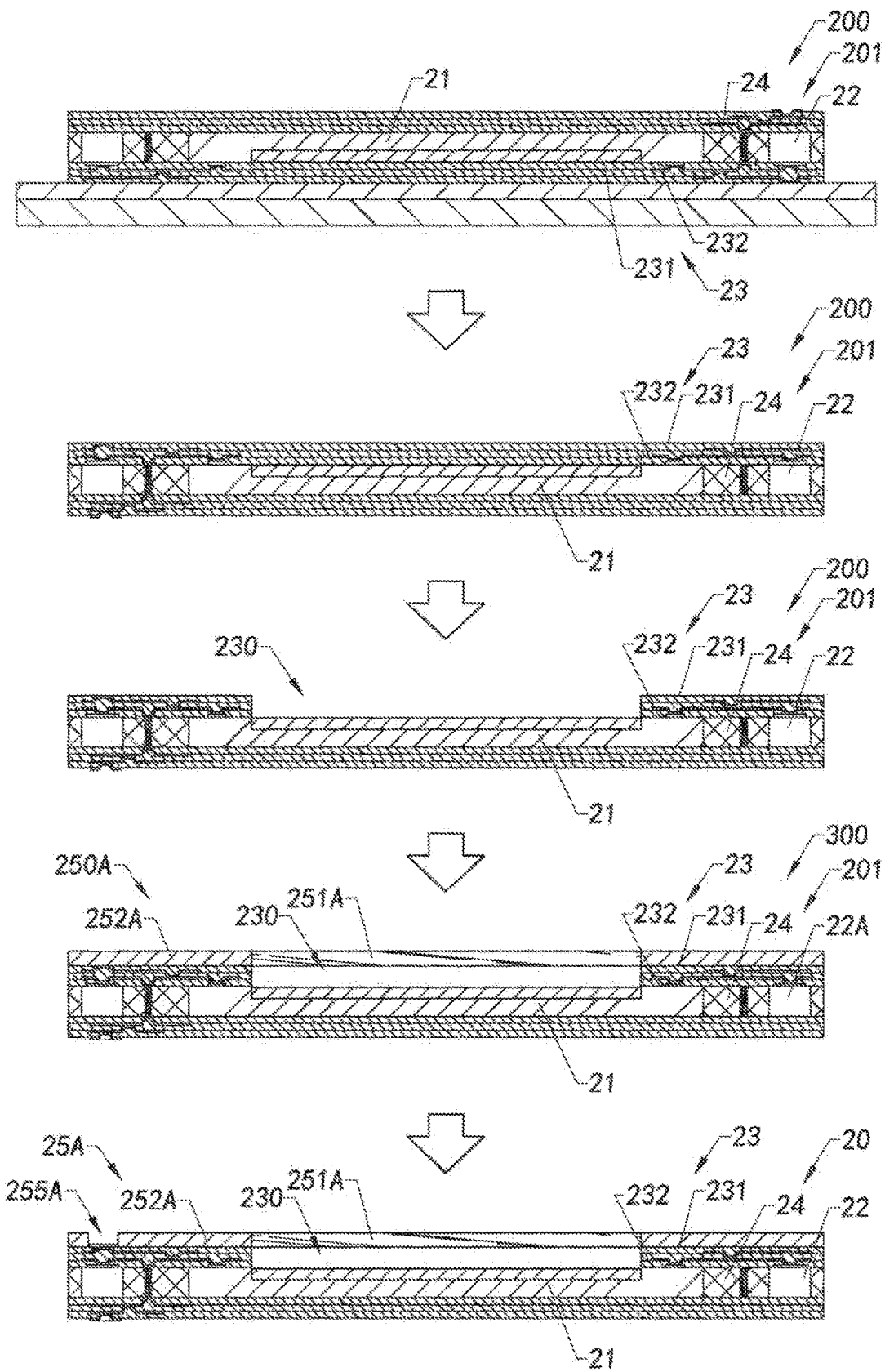
FIG. 10 is a schematic diagram of a manufacturing process of a photosensitive assembly according to another preferred example of the disclosure.

Accordingly, in an example of the disclosure, with reference to FIG. 10 and FIG. 6 together, the filter element jointed panel 250 further includes a series of pin through holes 255A for allowing the set of pins 300B of the drive element 30B to pass and be electrically connected to the top surface 231 of the extended wiring layer 23.

Figure 11:
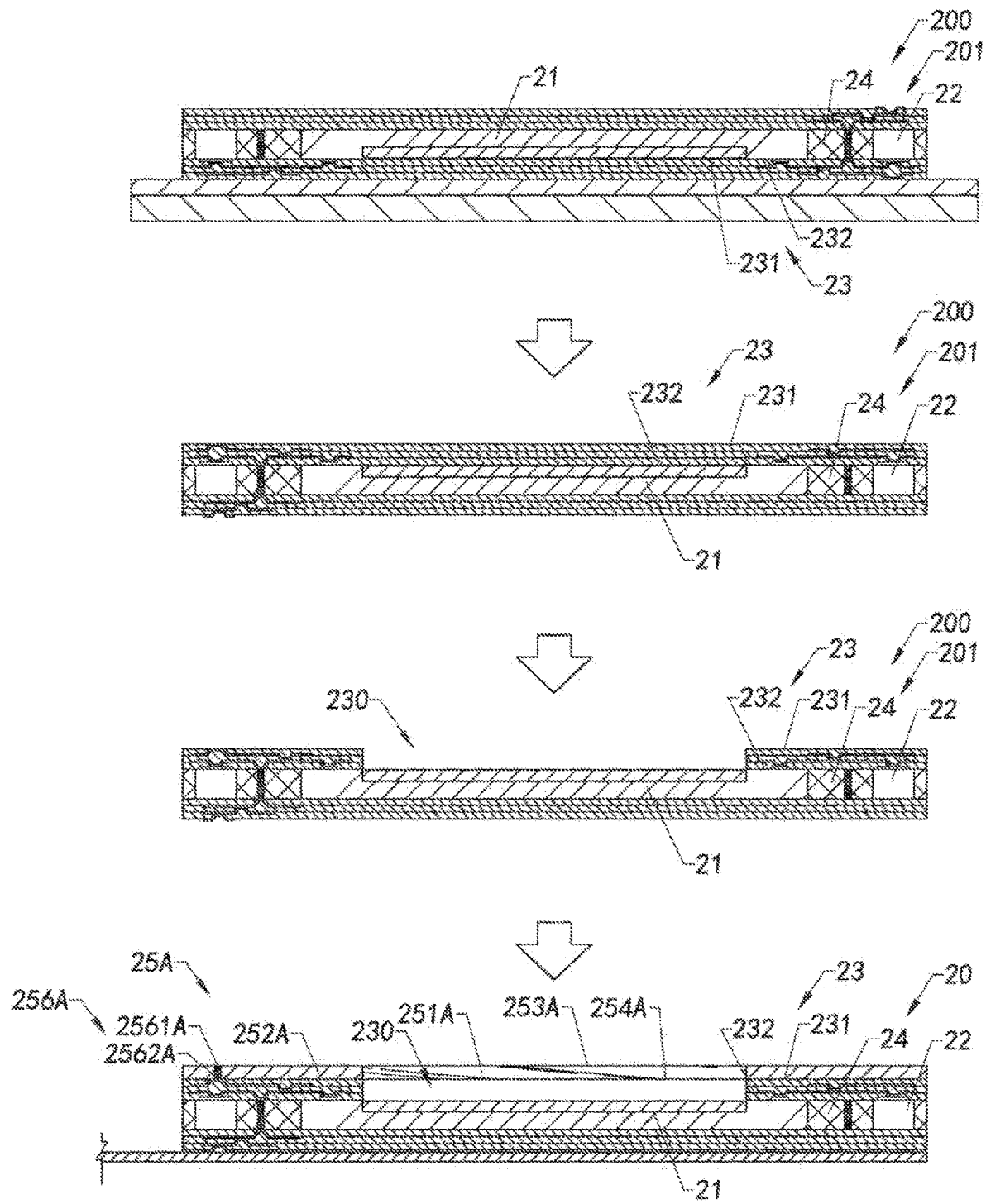
FIG. 11 is a schematic diagram of a manufacturing process of a photosensitive assembly according to another preferred example of the disclosure.

Accordingly, in an example of the disclosure, with reference to FIG. 11 and FIG. 7A together, the filter element jointed panel 250 further includes a series of conducting elements 256A. Each of the conducting elements 256A extends between the bonding layers 252A, and a first conducting end 2561A and a second conducting end 2562A of the conducting element 256A are respectively exposed to the top surface 253A and the bottom surface 254A of the filter element assembly 25A. When the filter element assembly 25A is attached to the top surface 231 of the extended wiring layer 23, the first conducting end 2561A of the conducting element 256A is electrically connected to the top surface 231 of the extended wiring layer 23 so that the filter element assembly 25A is electrically connected to the top surface 231 of the extended wiring layer 23. Meanwhile, the second conducting end 2562A of the conducting element 256A is exposed to the top surface of the filter element assembly 25A, so that when the drive element 30B is mounted on the top surface 253A of the filter element assembly 25A, the pins 300B of the drive element 30B may be aligned with and electrically connected to the second conducting end 2562A, respectively. In this way, the drive element 30B is electrically connected to the filter element assembly 25A. It should be readily appreciated that the drive element 30B is electrically connected to the filter element assembly 25A, and the drive element 25A is electrically connected to the top surface 231 of the extended wiring layer 23, thereby indirectly electrically connecting the drive element 30B to the extended wiring layer 23 through the conducting element 256A of the filter element assembly 25A.

According to another aspect of the disclosure, the disclosure also provides an electronic device 80. The electronic device includes an electronic device body 81 and a camera module 82 disclosed by the disclosure. The camera module 82 is assembled to the electronic device body 81 to provide an image function for the electronic device 80.

Figure 12:
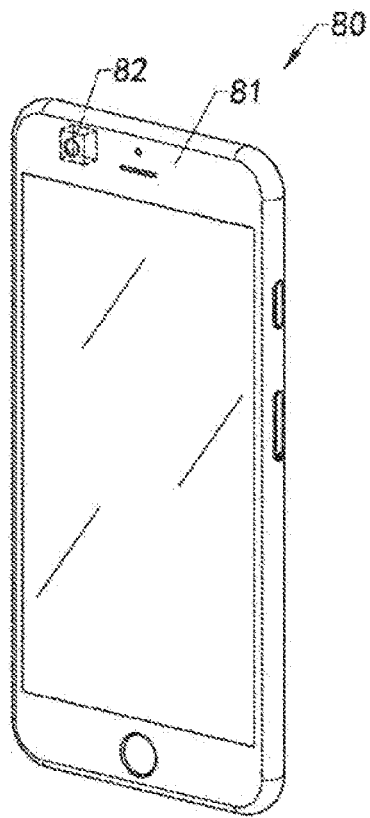
FIG. 12 is a schematic diagram of an electronic device according to a preferred example of the disclosure.
Figure 13:
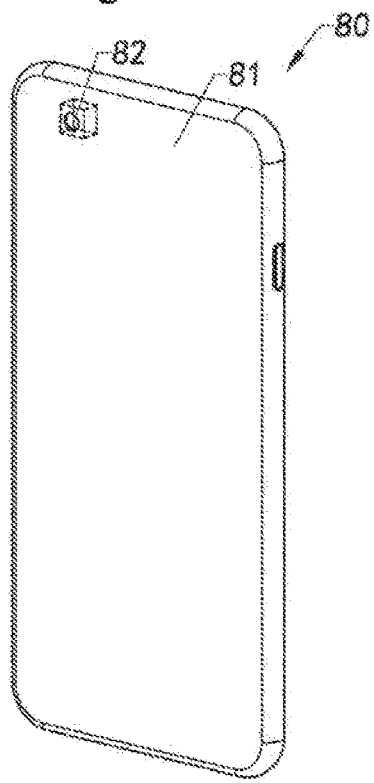
FIG. 13 is a schematic diagram of an electronic device according to another preferred example of the disclosure.

In particular, in a specific implementation mode of the electronic device 80 provided by the disclosure, the camera module 82 may be assembled on a front side of the electronic device body 81. That is to say, the camera module is a front camera module of the electronic device 80, as shown in FIG. 12. Or, the camera module 82 may be assembled on a rear side of the electronic device body 81. That is to say, the camera module 82 is a rear camera module of the electronic device 80, as shown in FIG. 13. Of course, in another implementation mode of the disclosure, the camera module 82 may be assembled to other positions of the electronic device body 81, which is not limited by the disclosure.

Thus, it can be seen that the object of the disclosure may be fully and efficiently accomplished. The examples, which serve to explain the functional and structural principles of the disclosure, have been fully illustrated and described, and the disclosure is not limited to modifications based on the principles of these examples. Therefore, the disclosure includes all modifications encompassed within the scope and spirit of the appended claims.

What is claimed is:

1. A photosensitive assembly, characterized by comprising:
    a photosensitive chip, including a photosensitive area and an electric connection area located around the photosensitive area;
    at least one resistance-capacitance device;
    an extended wiring layer, having a top surface and a bottom surface opposite to the top surface, wherein the photosensitive chip and the at least one resistance-capacitance device are electrically connected to the extended wiring layer, respectively, so that the photosensitive chip and the at least one resistance-capacitance device are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole;
    a filter element assembly, including a filter element and a bonding layer bonded around the filter element, wherein the filter element assembly is attached to the top surface of the extended wiring layer, and the filter element of the filter element assembly corresponds to the light transmission hole of the extended wiring layer, so that external light is filtered by the filter element before reaching the photosensitive area of the photosensitive chip through the light transmission hole;
    a molded base, in which the photosensitive chip and the at least one resistance-capacitance device are received respectively and on which the extended wiring layer is supported; and
    a second extended wiring layer and a circuit external connection layer, wherein the second extended wiring layer is located on a bottom side of the photosensitive assembly and electrically connected to the extended wiring layer, and the circuit external connection layer is electrically connected to a bottom side of the second extended wiring layer.

2. The photosensitive assembly of claim 1, wherein the filter element assembly has a top surface and a bottom surface opposite to the top surface, and the bottom surface of the filter element assembly is stacked on the top surface of the extended wiring layer when the filter element assembly is attached to the top surface of the extended wiring layer, and a dimension of the bottom surface of the filter element assembly is smaller than that of the top surface of the extended wiring layer.

3. The photosensitive assembly of claim 1, wherein the filter element assembly has a top surface and a bottom surface opposite to the top surface, and the bottom surface of the filter element assembly is superimposed on the top surface of the extended wiring layer when the filter element assembly is attached to the top surface of the extended wiring layer, and a dimension of the bottom surface of the filter element assembly corresponds to that of the top surface of the extended wiring layer.

4. The photosensitive assembly of claim 3, wherein the top surface of the filter element assembly is a flat surface, and the top surface of the filter element assembly is adapted to mount an optical lens, a lens barrel, or a drive element thereon.

5. The photosensitive assembly of claim 3, wherein the filter element assembly further includes a set of pin through holes for allowing a set of pins of the drive element to pass and be electrically connected to the top surface of the extended wiring layer.

6. The photosensitive assembly of claim 5, wherein the pin through holes are penetratingly formed in a peripheral area of the filter element assembly.

7. The photosensitive assembly of claim 3, wherein the filter element assembly further includes a set of conducting elements, and each of the conducting elements extends between the bonding layers, a first conducting end and a second conducting end of the conducting element are respectively exposed to the opposite top and bottom surfaces of the filter element assembly, and the first conducting end exposed to the bottom surface of the filter element assembly is electrically connected to the top surface of the extended wiring layer when the filter element assembly is attached to the top surface of the extended wiring layer so that the filter element assembly is electrically connected to the top surface of the extended wiring layer, and the second conducting end exposed to the top surface of the filter element assembly electrically connects the drive element to the filter element assembly.

8. The photosensitive assembly of claim 7, wherein the conducting elements are located in a peripheral area of the filter element assembly.

9. The photosensitive assembly of claim 1, wherein a dimension of the filter element assembly corresponds to a dimension of the opening of the light transmission hole.

10. The photosensitive assembly of claim 1, wherein the molded base is integrally bonded to the photosensitive chip and the at least one resistance-capacitance device.

11. A camera module, characterized by comprising:
    a photosensitive assembly, including:
    a photosensitive chip, including a photosensitive area and an electric connection area located around the photosensitive area;
    at least one resistance-capacitance device;
    an extended wiring layer, having a top surface and a bottom surface opposite to the top surface, wherein the photosensitive chip and the at least one resistance-capacitance device are electrically connected to the bottom surface of the extended wiring layer, respectively, so that the photosensitive chip and the at least one resistance-capacitance device are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole;

a filter element assembly, including a filter element and a bonding layer bonded around the filter element, wherein the filter element assembly is attached to the top surface of the extended wiring layer, and the filter element of the filter element assembly corresponds to the light transmission hole of the extended wiring layer, so that external light is filtered by the filter element before reaching the photosensitive area of the photosensitive chip through the light transmission hole;

a molded base, in which the photosensitive chip and the at least one resistance-capacitance device are received respectively and on which the extended wiring layer is supported;

an optical lens, mounted on a top side of the filter element assembly and held in a photosensitive path of the photosensitive assembly; and a second extended wiring layer and a circuit external connection layer, wherein the second extended wiring layer is located on a bottom side of the photosensitive assembly and electrically connected to the extended wiring layer, and the circuit external connection layer is electrically connected to a bottom side of the second extended wiring layer.

12. The camera module of claim 11, wherein the filter element assembly has a top surface and a bottom surface opposite to the top surface, and the bottom surface of the filter element assembly is stacked on the top surface of the extended wiring layer when the filter element assembly is attached to the top surface of the extended wiring layer, and a dimension of the bottom surface of the filter element assembly is smaller than that of the top surface of the extended wiring layer.

13. The camera module of claim 12, further including a lens barrel, wherein the lens barrel is mounted in an area of the top surface of the extended wiring layer that is not superimposed by the filter element assembly.

14. The camera module of claim 12, further including a drive element, wherein the drive element is mounted in and electrically connected to an area of the top surface of the extended wiring layer that is not superimposed by the filter element assembly.

15. The camera module of claim 11, wherein the filter element assembly has a top surface and a bottom surface opposite to the top surface, and the bottom surface of the filter element assembly is superimposed on the top surface of the extended wiring layer when the filter element assembly is attached to the top surface of the extended wiring layer, and a dimension of the bottom surface of the filter element assembly corresponds to that of the top surface of the extended wiring layer.

16. The camera module of claim 15, further including a lens barrel, wherein the lens barrel is mounted on the top surface of the filter element assembly.

17. The camera module of claim 15, further including a drive element, wherein the drive element is mounted on the top surface of the filter element assembly and electrically connected to the top surface of the extended wiring layer.

18. A photosensitive assembly manufacturing method, characterized by comprising the following steps:
manufacturing a filter element jointed panel including at least two filter elements and a bonding layer bonding the at least two filter elements;
manufacturing a semi-finished photosensitive assembly jointed panel including at least two semi-finished photosensitive assemblies, wherein each of the semi-finished photosensitive assemblies includes:
a photosensitive chip, including a photosensitive area and an electric connection area located around the photosensitive area;
at least one resistance-capacitance device;
an extended wiring layer, having a top surface and a bottom surface, wherein the photosensitive chip and the at least one resistance-capacitance device are electrically connected to the bottom surface of the extended wiring layer, respectively, so that the at least one resistance-capacitance device and the photosensitive chip are conducted through the extended wiring layer, and the top surface of the extended wiring layer defines and forms a top surface of the photosensitive assembly, and the extended wiring layer has a light transmission hole corresponding to at least the photosensitive area of the photosensitive chip, so as to allow external light to reach at least the photosensitive area of the photosensitive chip through the light transmission hole;
a molded base, integrally combined with the photosensitive chip, the at least one resistance-capacitance device, and the extended wiring layer; and
a second extended wiring layer and a circuit external connection layer, wherein the second extended wiring layer is located on a bottom side of the photosensitive assembly and electrically connected to the extended wiring layer, and the circuit external connection layer is electrically connected to a bottom side of the second extended wiring layer;
attaching the filter element jointed panel to the semi-finished photosensitive assembly jointed panel to form a photosensitive assembly jointed panel, wherein each of the filter elements of the filter element jointed panel corresponds to the light transmission hole of each of the semi-finished photosensitive assemblies; and
cutting the photosensitive assembly jointed panel to obtain at least two photosensitive assemblies.

* * * * *